(12) United States Patent
Matsuura et al.

(10) Patent No.: US 8,576,948 B2
(45) Date of Patent: Nov. 5, 2013

(54) ANGLE MODULATOR, TRANSMISSION DEVICE, AND WIRELESS COMMUNICATION DEVICE

(75) Inventors: Toru Matsuura, Kanagawa (JP); Kenji Miyanaga, Kanagawa (JP)

(73) Assignee: Panasonic Corporation, Osaka (JP)

( * ) Notice: Subject to any disclaimer, the term of this patent is extended or adjusted under 35 U.S.C. 154(b) by 117 days.

(21) Appl. No.: 13/256,894

(22) PCT Filed: Dec. 17, 2010

(86) PCT No.: PCT/JP2010/007337
§ 371 (c)(1),
(2), (4) Date: Oct. 14, 2011

(87) PCT Pub. No.: WO2011/089675
PCT Pub. Date: Jul. 28, 2011

(65) Prior Publication Data
US 2012/0020390 A1    Jan. 26, 2012

(30) Foreign Application Priority Data

Jan. 19, 2010   (JP) ................................. 2010-009156

(51) Int. Cl.
| | |
|---|---|
| H04B 1/38 | (2006.01) |
| H04B 7/00 | (2006.01) |
| H03C 1/50 | (2006.01) |
| H03C 3/02 | (2006.01) |

(52) U.S. Cl.
USPC ......................................................... 375/302

(58) Field of Classification Search
None
See application file for complete search history.

(56) References Cited

U.S. PATENT DOCUMENTS

| | | | | |
|---|---|---|---|---|
| 4,027,274 | A | * | 5/1977 | Fukui et al. ................... 332/127 |
| 4,166,984 | A | * | 9/1979 | Jenkins ......................... 331/1 A |
| 4,513,428 | A | * | 4/1985 | Roeder ......................... 375/376 |
| 4,929,917 | A | * | 5/1990 | Yokogawa et al. ........... 331/1 A |
| 5,400,372 | A | * | 3/1995 | Watanabe et al. ............. 375/376 |
| 5,446,767 | A | * | 8/1995 | Nakagawa et al. ........... 375/376 |
| 5,847,611 | A | * | 12/1998 | Hirata .......................... 331/1 A |
| 6,094,101 | A | | 7/2000 | Sander |
| 6,728,493 | B1 | * | 4/2004 | Whittaker et al. ............ 398/155 |

(Continued)

FOREIGN PATENT DOCUMENTS

| | | |
|---|---|---|
| JP | 2002-539705 | 11/2002 |
| JP | 2008-79261 | 4/2008 |

OTHER PUBLICATIONS

International Search Report dated Feb. 22, 2010.

*Primary Examiner* — Chieh M Fan
*Assistant Examiner* — Bahman Badipour
(74) *Attorney, Agent, or Firm* — Dickinson Wright PLLC

(57) ABSTRACT

Disclosed are an angle modulator, a transmission apparatus, and a radio communication apparatus that can compensate phase discontinuity when an operational mode of a voltage controlled oscillator is switched. Angle modulator (100) includes phase difference detection section (150) that detects a difference of phases between an input signal of subtractor (141) and an angle modulated signal, using the result of subtraction by subtractor (141) of frequency locked loop circuit (140); correction control section (160) that generates a control signal for compensating that difference of phases based on that difference of phases; correction section (120) that corrects the phase of the angle modulated signal by adding the control signal to an input signal of angle modulator (100), an input signal of loop filter (142), or an input signal of VCO (143) during a predetermined period after VCO (143) switches the operational mode (from time t3 to time t4).

18 Claims, 18 Drawing Sheets

(56) References Cited

U.S. PATENT DOCUMENTS

| | | | |
|---|---|---|---|
| 6,924,711 B2* | 8/2005 | Liu | 332/159 |
| 7,054,403 B2* | 5/2006 | Nosaka et al. | 375/376 |
| 7,170,322 B2* | 1/2007 | Gonzalez et al. | 327/148 |
| 7,450,666 B2* | 11/2008 | Miyanaga et al. | 375/333 |
| 7,504,893 B2* | 3/2009 | Gonzalez et al. | 331/17 |
| 7,599,418 B2* | 10/2009 | Ahmed | 375/135 |
| 8,009,761 B2* | 8/2011 | Lai et al. | 375/296 |
| 2003/0016079 A1* | 1/2003 | Carrozza et al. | 329/304 |
| 2003/0118143 A1* | 6/2003 | Bellaouar et al. | 375/376 |
| 2006/0033582 A1* | 2/2006 | Staszewski et al. | 331/16 |
| 2006/0038620 A1* | 2/2006 | Drapkin et al. | 331/16 |
| 2006/0055466 A1* | 3/2006 | Hirano et al. | 331/16 |
| 2007/0036238 A1* | 2/2007 | Matero et al. | 375/296 |
| 2007/0085579 A1* | 4/2007 | Wallberg et al. | 327/156 |
| 2007/0149148 A1* | 6/2007 | Yoshikawa et al. | 455/110 |
| 2007/0205831 A1* | 9/2007 | Yoshikawa et al. | 331/16 |
| 2007/0223639 A1* | 9/2007 | Unterricker | 375/376 |
| 2009/0108891 A1 | 4/2009 | Sander | |
| 2010/0315140 A1* | 12/2010 | Mayer et al. | 327/159 |
| 2011/0081863 A1* | 4/2011 | Mendel | 455/42 |
| 2012/0092048 A1* | 4/2012 | Mayer et al. | 327/156 |

* cited by examiner

ANGLE MODULATOR, TRANSMISSION DEVICE, AND WIRELESS COMMUNICATION DEVICE

TECHNICAL FIELD

The present invention relates to an angle modulator, a transmission apparatus, and a radio communication apparatus used for communication devices such as a mobile phone or a wireless local area network (LAN). More specifically, the present invention relates to an angle modulator, a transmission apparatus, and a radio communication apparatus that compensate phase discontinuity when characteristics of a voltage controlled oscillator (VCO) change.

BACKGROUND ART

A conventional angle modulator is described below. FIG. 1 is a block diagram showing a configuration of the conventional angle modulator described in Patent Literature 1.

In angle modulator 10 of FIG. 1, a frequency signal input from input terminal 11 is a signal that will be frequency modulated in angle modulator 10. The frequency signal is input to adder 12, where a constant, representing information about the frequency corresponding to the center frequency of a modulated signal after modulation, is added to the frequency signal. The result of the addition in adder 12 is input to subtractor 13 and the result of frequency detection in frequency detection section 16 is subtracted from the addition result in adder 12. The result of the subtraction in subtractor 13 is input to loop filter 14, where an unnecessary signal is removed. Output of loop filter 14 is input to voltage controlled oscillator (VCO) 15, where a frequency corresponding to voltage is generated and is output from output terminal 17. Output of VCO 15 is converted into a frequency signal in frequency detection section 16.

Generally, VCO 15 can realize lower noise as current consumption is greater. Further, low noise is demanded only when output power of a transmission apparatus using angle modulator 10 of FIG. 1 is large, and therefore, low current consumption is desired when output power of the transmission apparatus is small. For this reason, as shown in FIG. 1, a configuration of switching VCO 15 to a low noise mode or a low current mode using a mode switching signal corresponding to output power of a transmission apparatus, is possible.

CITATION LIST

Patent Literature

PTL 1
United States Patent Application Publication No. 2009/0108891

SUMMARY OF INVENTION

Technical Problem

However, the above-described conventional configuration has a problem that characteristics of VCO 15 change when the mode is switched, and the frequency of an output signal of VCO 15 changes until the frequency is locked again, so that phase discontinuity of a modulated signal arises.

It is therefore an object of the present invention to provide an angle modulator, a transmission apparatus, and a radio communication apparatus that can compensate phase discontinuity due to mode switching of VCO and realize low power consumption.

Solution to Problem

An angle modulator according to the present invention employs a configuration to using a frequency locked loop circuit, the frequently locked loop comprising a subtractor, a loop filter, a voltage controlled oscillator that has a plurality of operational modes and generates an angle modulated signal by switching the operational mode according to a mode switching signal, a frequency detection section that detects a frequency of the angle modulated signal, the subtractor subtracting the frequency detected by the frequency detection section from an input signal of the subtractor; the angle modulator comprising: a phase difference detection section that detects a difference of phases between an angle signal input to the angle modulator and the angle modulated signal; a correction control section that generates a control signal that compensates the difference of phases based on the difference of phases; and a correction section that corrects the phase of the angle modulated signal by adding the control signal to the angle signal, an input signal of the loop filter, or an input signal of the voltage controlled oscillator; wherein the subtractor receives as input a frequency signal corresponding to the angle signal, or a frequency signal corresponding to a signal obtained by adding the control signal to the angle signal.

A transmission apparatus according to the present invention employs a configuration to comprise: a coordinate system conversion section that receives as input an I signal and a Q signal, and outputs an amplitude signal and a phase signal corresponding to the I signal and the Q signal; the above angle modulator that receives as input the phase signal, and generates the angle modulated signal by angle modulating the phase signal; and an amplitude modulator that generates a modulated signal by amplitude modulating the angle modulated signal according to the amplitude signal.

A transmission apparatus according to the present invention employs a configuration to comprise: a coordinate system conversion section that receives as input an I signal and a Q signal, and outputs an amplitude signal and a phase signal corresponding to the I signal and the Q signal; a conversion section that converts the phase signal into a frequency signal; the above angle modulator that receives as input the frequency signal, and generates the angle modulated signal by angle modulating the frequency signal; and an amplitude modulator that generates a modulated signal by amplitude modulating the angle modulated signal according to the amplitude signal.

A radio communication apparatus according to the present invention employs a configuration to comprise: the above transmission apparatus that receives as input transmission data and generates the modulated signal; a reception apparatus that receives and modulates the modulated signal and outputs reception data; an antenna duplexer that is connected to output of the transmission apparatus and input of the reception apparatus; and an antenna that is connected to the other terminal of the antenna duplexer.

Advantageous Effects of Invention

According to the present invention, it is possible to ensure contiguousness of a phase even when the operational mode of VCO is switched.

DESCRIPTION OF EMBODIMENTS

Now, embodiments of the present invention will be described in detail with reference to the accompanying drawings.

Embodiment 1

Figure 1:
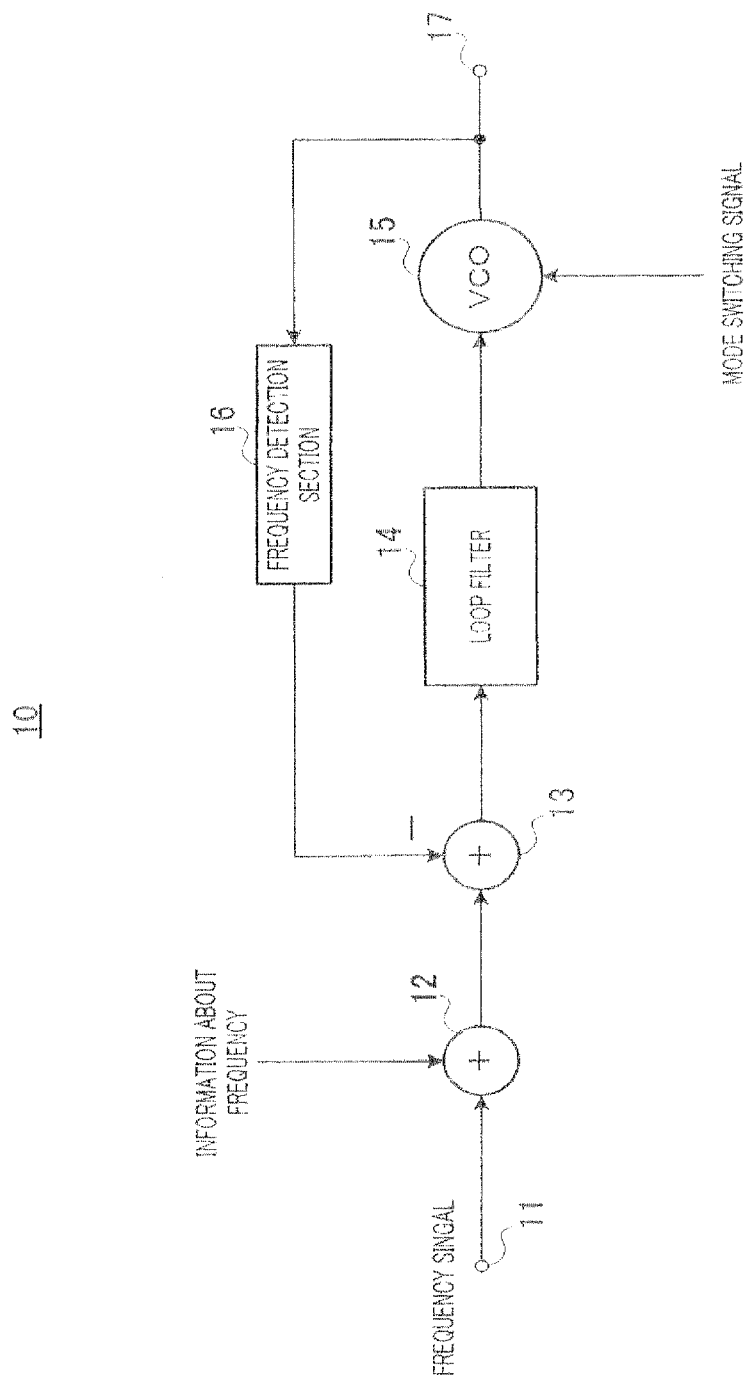
FIG. 1 is a block diagram showing a main configuration of a conventional angle modulator.
Figure 2:
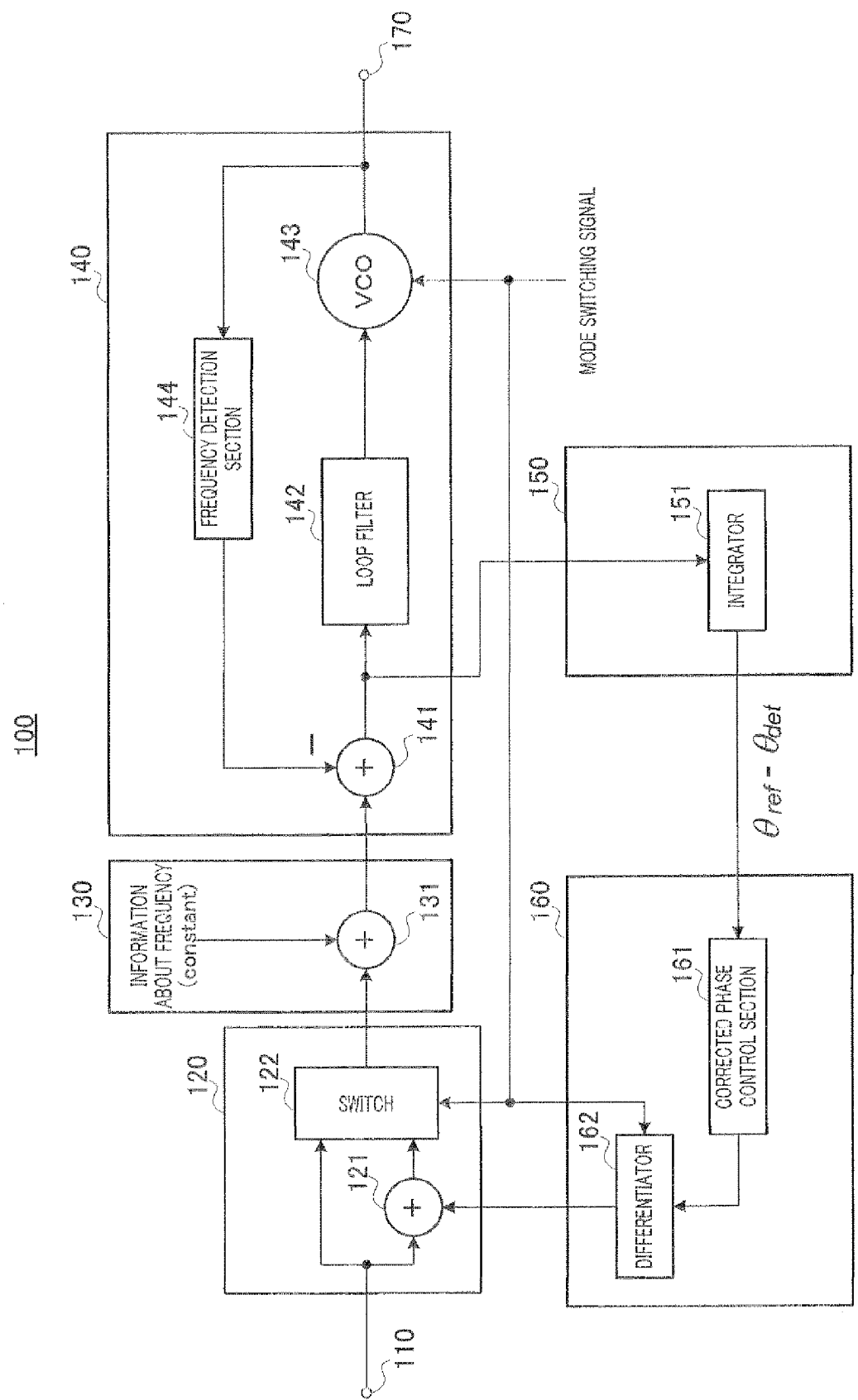
FIG. 2 is a block diagram showing a main configuration of an angle modulator according to Embodiment 1 of the present invention.

FIG. 2 is a block diagram showing a main configuration of an angle modulator according to Embodiment 1. Angle modulator 100 according to the present embodiment includes correction section 120, adjustment section 130, frequency locked loop (FLL) circuit 140, phase difference detection section 150, and correction control section 160. A case will be described below where voltage controlled oscillator (VCO) 143 in frequency locked loop circuit 140 has two operational modes of mode 1 and mode 2.

A frequency signal is input to input terminal 110 as an angle signal input to angle modulator 100. Here, from the relationship in the following equation, as frequency signal, "f," that is input to input terminal 110, it is possible to use differential $\Delta\theta$ of a phase of a modulated signal.

$$f = \Delta\theta \cdot fs / 2\pi$$

In the above equation, "fs" represents a sampling frequency.

In either case, taking into account gain of VCO 143 (described later), it is necessary to adjust the scale of input voltage so that a desired frequency will be output. A case will be described below with the present embodiment where differential $\Delta\theta$ of a phase is input to input terminal 110.

Correction section 120 includes adder 121 and switch 122.

Adder 121 adds a control signal output from differentiator 162 (described later) to the angle signal, to generate a signal in which the phase of the angle signal is corrected (hereinafter referred to as "corrected signal.") Adder 121 outputs the corrected signal to switch 122.

Switch 122 switches an output signal to be output to adjustment section 130 in the later stage, to an angle signal or a corrected signal. Switching by switch 122 will be described later.

Adjustment section 130 adjusts the corrected signal in frequency locked loop circuit 140 in the later stage, so that the center frequency of a radio frequency signal to be output from angle modulator 100 becomes the center frequency of a signal that needs to be output from angle modulator 100 (hereinafter referred to as "angle modulated signal.") Adjustment section 130 is configured with, for example, adder 131, and adds a constant corresponding to the center frequency of the angle modulated signal, to the corrected signal. Adjustment section 130 outputs the corrected signal after adjustment to frequency locked loop circuit 140.

Frequency locked loop circuit 140 includes subtractor 141, loop filter 142, VCO 143, and frequency detection section 144.

Subtractor 141 subtracts the result of frequency detection detected by frequency detection section 144 (described later) from the corrected signal adjusted by adjustment section 130. Subtractor 141 outputs the result of the subtraction to loop filter 142 and phase difference detection section 150.

Loop filter 142 receives as input the subtraction result in subtractor 141, removes an unnecessary component from the subtraction result, and outputs the subtraction result after removal to VCO 143.

VCO 143 switches the operational mode depending on a mode switching signal. VCO 143 generates a radio frequency angle modulated signal corresponding to the voltage of the signal input from loop filter 142, and outputs the generated angle modulated signal to output terminal 170 and frequency detection section 144. By this means, the radio frequency angle modulated signal is output from output terminal 170.

Frequency detection section 144 detects the frequency of the angle modulated signal generated by VCO 143, and outputs the result of the frequency detection to subtractor 141.

As described above, the frequency detection result detected by frequency detection section 144 is input to subtractor 141, and subtractor 141 subtracts the frequency detection result in frequency detection section 144 from output (frequency-adjusted corrected signal) of adjustment section 130. By doing so, because frequency locked loop circuit 140 employs a feedback configuration, it is possible to output a stable angle modulated signal.

Phase difference detection section 150 detects the difference of phases between phase $\theta_{det}$ of an angle modulated signal and phase $\theta_{ref}$ corresponding to the input signal of subtractor 141.

Phase difference detection section 150 is configured with integrator 151, for example. Integrator 151 receives as input the substraction result from subtractor 141, and generates the difference of phases $(-\theta_{det}+\theta_{ref})$ by integrating the subtraction result. That is, phase difference detection section 150 generates the difference of phases between the angle modulated signal (output signal of frequency locked loop circuit 140) and the input signal of subtractor 141 (input signal of frequency locked loop circuit 140). Phase difference detection section 150 outputs the generated difference of phases to correction control section 160. Here, integrator 151 needs to be reset and activated before the operational mode of VCO 143 is switched.

Correction control section 160, based on difference of phases $(-\theta_{det}+\theta_{ref})$, generates a control signal for compensating that difference of phases. Correction control section 160 includes corrected phase control section 161 and differentiator 162.

Corrected phase control section 161 receives as input the mode switching signal and difference of phases $(-\theta_{det}+\theta_{ref})$ from integrator 151. Corrected phase control section 161 generates a phase domain control signal based on difference of phases $(-\theta_{det}+\theta_{ref})$, during a predetermined period after the mode switching signal is input and the operational mode of VCO 143 is switched. The control signal will be described later. Corrected phase control section 161 outputs the control signal to differentiator 162.

Differentiator 162 receives as input the phase domain control signal generated in corrected phase control section 161, and differentiates that control signal to generate a frequency domain control signal. Differentiator 162 outputs the frequency domain control signal to adder 121.

By doing so, adder 121 generates a corrected signal by adding the frequency domain control signal to the angle signal, and outputs the corrected signal to adjustment section 130 via switch 122.

An operation of angle modulator 100 configured as described above will be explained below. A case will be described as an example below where the operational mode of VCO 143 transitions from mode 1 to mode 2.

Figure 3:
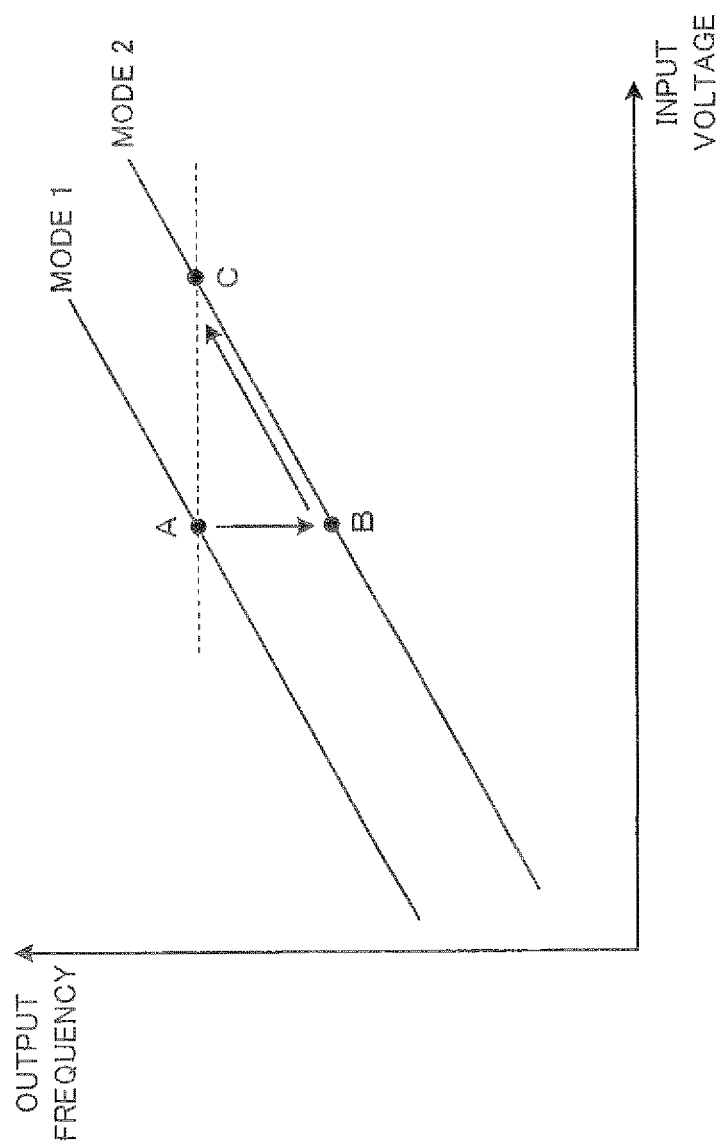
FIG. 3 shows characteristics of a voltage controlled oscillator according to Embodiment 1.

FIG. 3 shows voltage vs. frequency (V-F) characteristics of VCO 143. When the operational mode of VCO 143 is switched from mode 1 to mode 2, an output frequency transitions from point A to point B, and later, input voltage is increased due to feedback control by frequency locked loop circuit 140, and the output frequency transitions to point C.

The frequency signal input from input terminal 110 is input to adder 121 or switch 122.

In the steady state of mode 1, by controlling switch 122 according to the mode switching signal, adder 121 is bypassed. That is, adjustment section 130 receives as input the frequency signal that is input to input terminal 110. In adjustment section 130, the constant corresponding to the center frequency of an angle modulated signal that needs to be output by angle modulator 100 is added, and the corrected signal after addition is output to subtractor 141 in frequency locked loop circuit 140. Output of subtractor 141 is output to loop filter 142, where an unnecessary component is removed from the subtraction result in subtractor 141, and the output after removal is input to VCO 143. VCO 143 generates a radio frequency angle modulated signal having a frequency corresponding to the voltage of the input signal, and the angle modulated signal is output from output terminal 170. On the other hand, output of VCO 143 is input to frequency detection section 144, where the frequency of the input angle modulated signal is detected. The detected frequency signal is input to subtractor 141, and subtractor 141 outputs a signal that is obtained by subtracting output (frequency) from frequency detection section 144 from output (corrected signal after frequency adjustment) of adjustment section 130.

Next, an operation of phase compensation at the time when the operational mode of angle modulator 100 transitions, will be described below, taking a case where the operational mode of VCO 143 is switched from mode 1 to mode 2 as an example.

Figure 4:
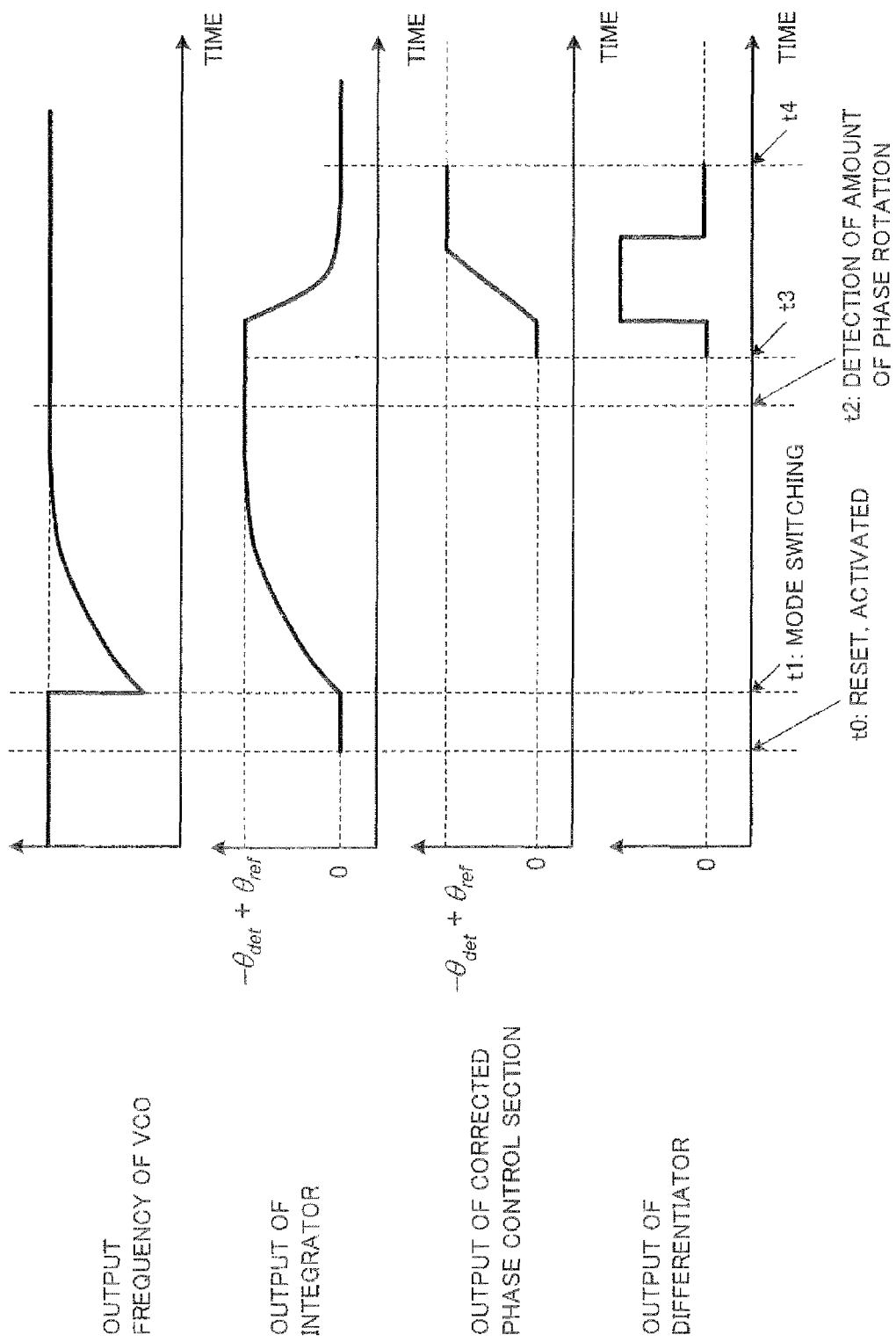
FIG. 4 shows output of each block according to Embodiment 1.

FIG. 4 shows an output frequency of VCO 143, an output value (difference of phases) of phase difference detection section 150 (integrator 151), an output value (phase domain control signal) of corrected phase control section 161, and an output value (frequency domain control signal) of differentiator 162. Further, in FIG. 4, time t1 represents the timing of mode switching, and time t0 represents time before time t1 of the timing of mode switching and the timing at which integrator 151 is reset and activated. Further, time t2 represents time after the frequency of VCO 143 is stabilized, and time t3 represents time after t2.

As shown in FIG. 4, integrator 151 integrates the input signal from time t0, which is before the timing of mode switching. The result of the integration during that time shows change of the phase from time t0. When mode switching occurs at time t1, at time t2 after the output frequency of VCO 143 is stabilized, integrator 151 outputs the amount of change of the phase $(\theta_{det}+\theta_{ref})$ that is obtained from time t0 to time t2.

Corrected phase control section 161 outputs a lamp signal having an amplitude of $(-\theta_{det}+\theta_{ref})$, as a phase domain control signal, from time t3, which is after time t2. As a result of this, as shown in FIG. 4, differentiator 162 outputs a rectangular signal having an area of $(-\theta_{det}+\theta_{ref})$ as the frequency domain control signal.

As described above, corrected phase control section 161 and differentiator 162 outputs the control signal from time t3 to time t4. Here, time t4 is the time that is some time after output of differentiator 162 becomes 0.

By doing so, from time t3 to time t4, a rectangular signal as a frequency domain control signal is output from differentiator 162 to adder 121, and, in adder 121, the rectangular signal is added to the signal input from input terminal 110.

During the rectangular signal is output from differentiator 162 to adder 121 (i.e. from time t3 to time t4), switch 122 is connected to adder 121, and switch 122 is controlled so that an angle signal to which the rectangular signal is added, is output to adjustment section 130. By using this control, it is possible to compensate the amount of phase rotation accompanying transition of the operational mode of VCO 143.

Although a case has been described with the above embodiment where time t2 that is after the frequency of VCO 143 is stabilized is predetermined based on time t1 at which the operational mode is switched, the present invention is not limited to this, and it is equally possible to set time t2 based on the detection result (difference of phases) of phase difference detection section 150 (integrator 151). For example, it is possible to monitor change of output of integrator 151 and set the time at which the change of output becomes substantially flat as time t2. Specifically, it is possible to differentiate output of integrator 151, and set the time at which the absolute value of the differentiate value is a predetermined threshold value or smaller, as time t2.

Figure 5:
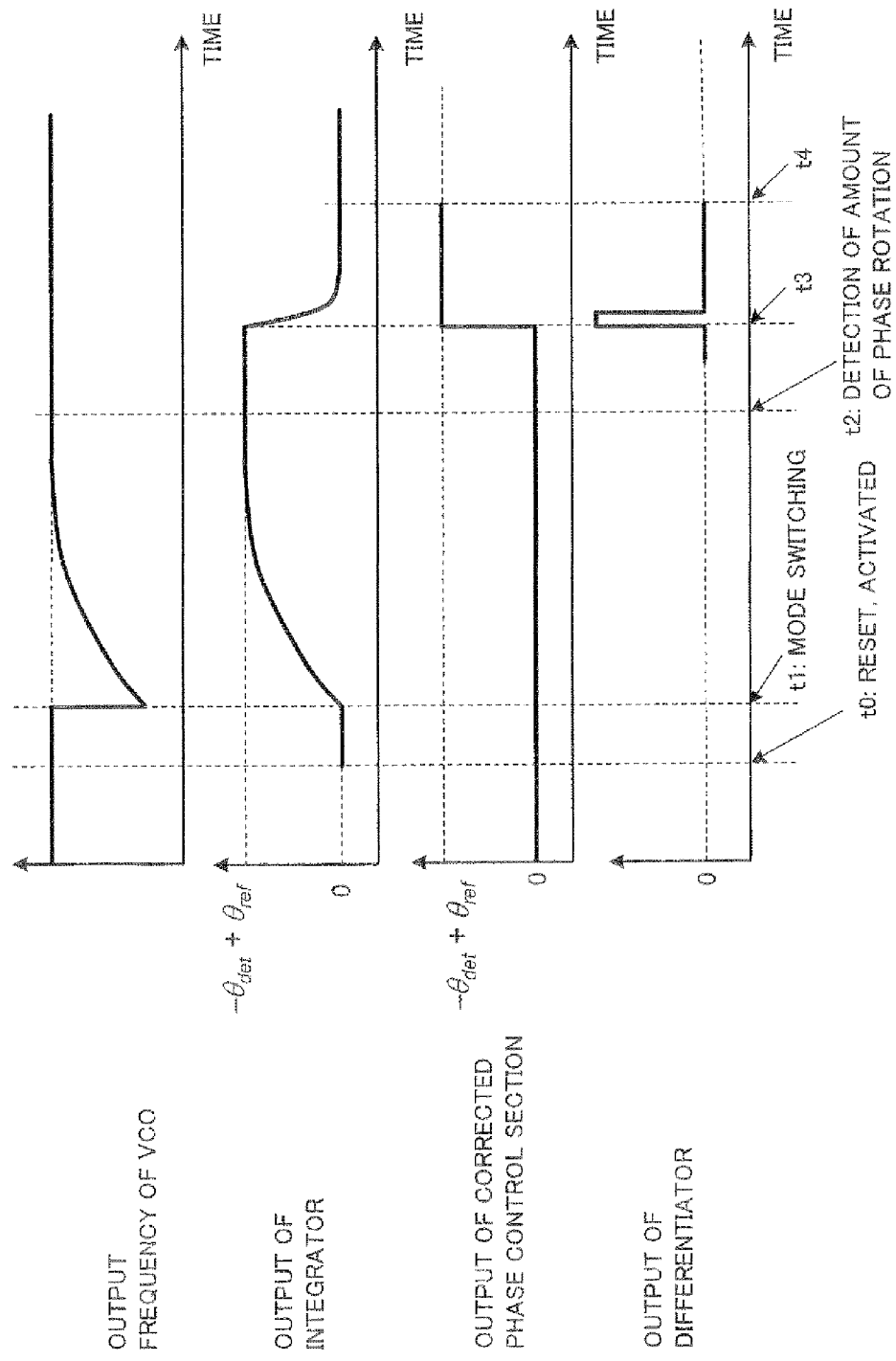
FIG. 5 shows output of each block according to Embodiment 1.

Here, the phase domain control signal that is generated by corrected phase control section 161 is not limited to a lamp signal. For example, as shown in FIG. 5, corrected phase control section 161 can generate a rectangular wave control signal. In this case, time required for phase compensation is shortened, but output (frequency domain control signal) of differentiator 162 is significantly large.

As described above, according to the present embodiment, correction section 120 generates a corrected signal by correcting the phase of an angle signal input to angle modulator 100. Then, phase difference detection section 150 detects the difference of phases between the corrected signal and the angle modulated signal using the subtraction result by subtractor 141 in frequency locked loop circuit 140. Then, based on that difference of phases, correction control section 160 generates a control signal for compensating the difference of phases. Then, subtractor 141 subtracts the frequency detected by frequency detection section 144 in frequency locked loop circuit 140, from the corrected signal. Then, VCO 143 switches the operational mode according to the mode switching signal. Then, during a predetermined period after VCO 143 switches the operational mode (from time t3 to time t4), correction section 120 generates a corrected signal by adding a control signal to the angle signal. By this means, it is possible to compensate the amount of phase rotation accompanying the change of the mode of VCO 143. Here, after time t4, if adder 121, correction control section 160, and phase difference detection section 150 are turned off, it is possible to reduce power consumption.

Further, it is possible to remove switch 122 so that the result of the addition in adder 121 can always pass through adjustment section 130. In this case, during the period in which phase compensation is not performed, output (frequency domain control signal) of differentiator 162 is set 0.

Figure 6:
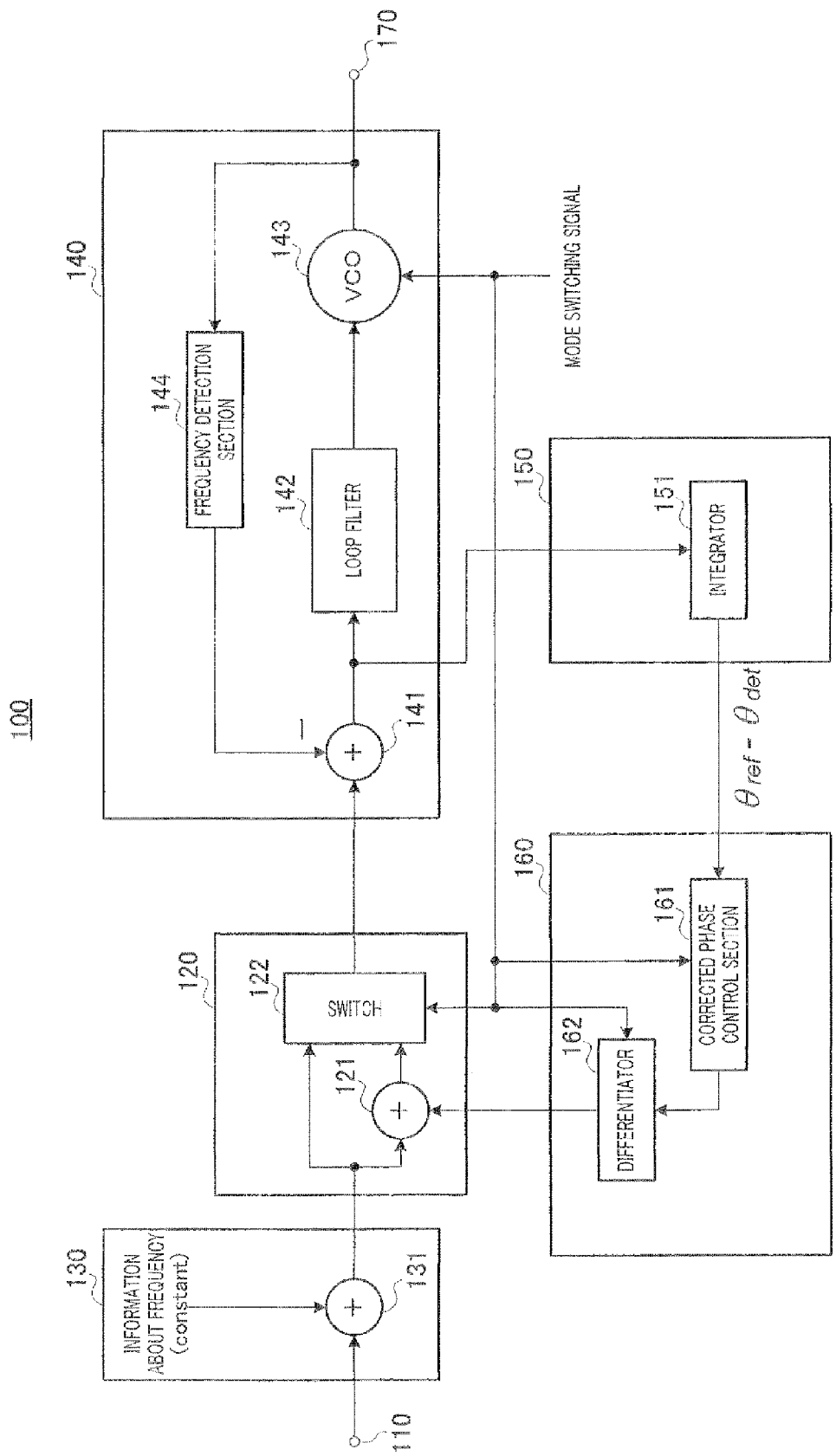
FIG. 6 is a block diagram showing another main configuration of an angle modulator according to Embodiment 1.

Further, the position in which correction section 120 is inserted can be any position between output of input terminal 110 and input of VCO 143. That is, it is possible to provide correction section 120 anywhere in the earlier stage of VCO 143. FIG. 6 is a block diagram showing a configuration of angle modulator 100 that is configured to provide correction section 120 between adjustment section 130 and frequency locked loop circuit 140.

That is, angle modulator 100 is provided with subtractor 141; loop filter 142; VCO 143 that has a plurality of operational modes and generates an angle modulated signal by switching an operational mode according to a mode switching signal; frequency detection section 144 that detects a frequency of the angle modulated signal generated by VCO 143; subtractor 141 being an angle modulator using frequency locked loop circuit 140 that subtracts the frequency detected by frequency detection section 144 from an input signal of subtractor 141; phase difference detection section 150 that detects the difference of phases between the input signal of subtractor 141 and the angle modulated signal using the result of the subtraction by subtractor 141; correction control section 160 that generates a control signal that compensates that difference of phases based on that difference of phases, and correction section 120 that corrects the phase of the angle modulated signal by adding the control signal to the angle signal, an input signal of loop filter 142, or an input signal of VCO 143 during a predetermined period after VCO 143 switches the operational mode (from time t3 to time t4).

When angle modulator 100 is further provided with adjustment section 130 that adds a constant corresponding to the center frequency of the angle modulated signal to the angle signal or the input signal of subtractor 141, correction section 120 corrects the phase of angle modulated signal by adding the control signal to the angle signal to which the constant corresponding to the center frequency of the angle modulated signal is added by adjustment section 130, the input signal of subtractor 141, the input signal of the loop filter 142, or the input signal of VCO 143.

Further, it is possible to provide a corrected frequency control section instead of corrected phase control section 161 and differentiator 162. In this case, the corrected frequency control section can be configured to output a signal having an amplitude of a (a: constant) to adder 121 during predetermined period T0, and control predetermined period T0 so that T0 is proportional to output of integrator 151, and make an area of the output signal, a·T0, correspond to the result of the output of integrator 151, i.e. difference of phases $(-\theta_{det}+\theta_{ref})$.

Figure 7:
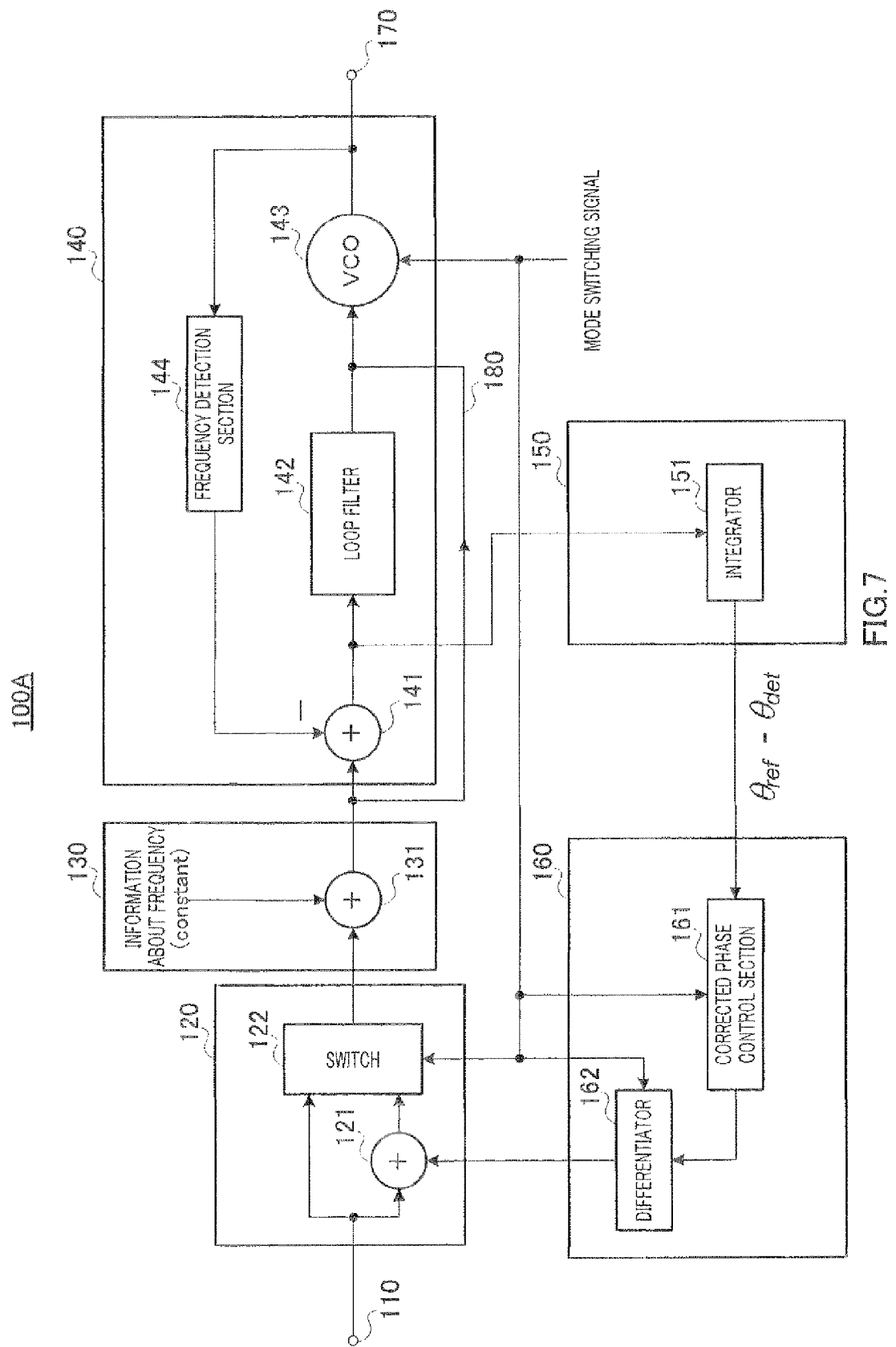
FIG. 7 is a block diagram showing a main configuration of an angle modulator according to Embodiment 1.

When the bandwidth for modulation is wider than the loop bandwidth of frequency locked loop circuit 140, two-point modulation is applied. FIG. 7 is a block diagram showing a main configuration of an angle modulator when two-point modulation is applied. Here, parts in the angle modulator of FIG. 7 that are the same as in FIG. 2 will be assigned the same reference numerals as in FIG. 2 and overlapping explanations will be omitted. Compared to angle modulator 100 of FIG. 2, angle modulator 100A of FIG. 7 is configured to add path 180 that connects output of adder 131 to input of VCO 143.

A case has been described with the above embodiment where the angle signal input to the angle modulator is a frequency signal. That is, a case has been described where a control signal is added to an angle signal in a frequency domain. When the angle signal to input to the angle modulator is a phase signal, a configuration in which a control signal is added to an angle signal in a phase domain, is also possible.

Figure 8:
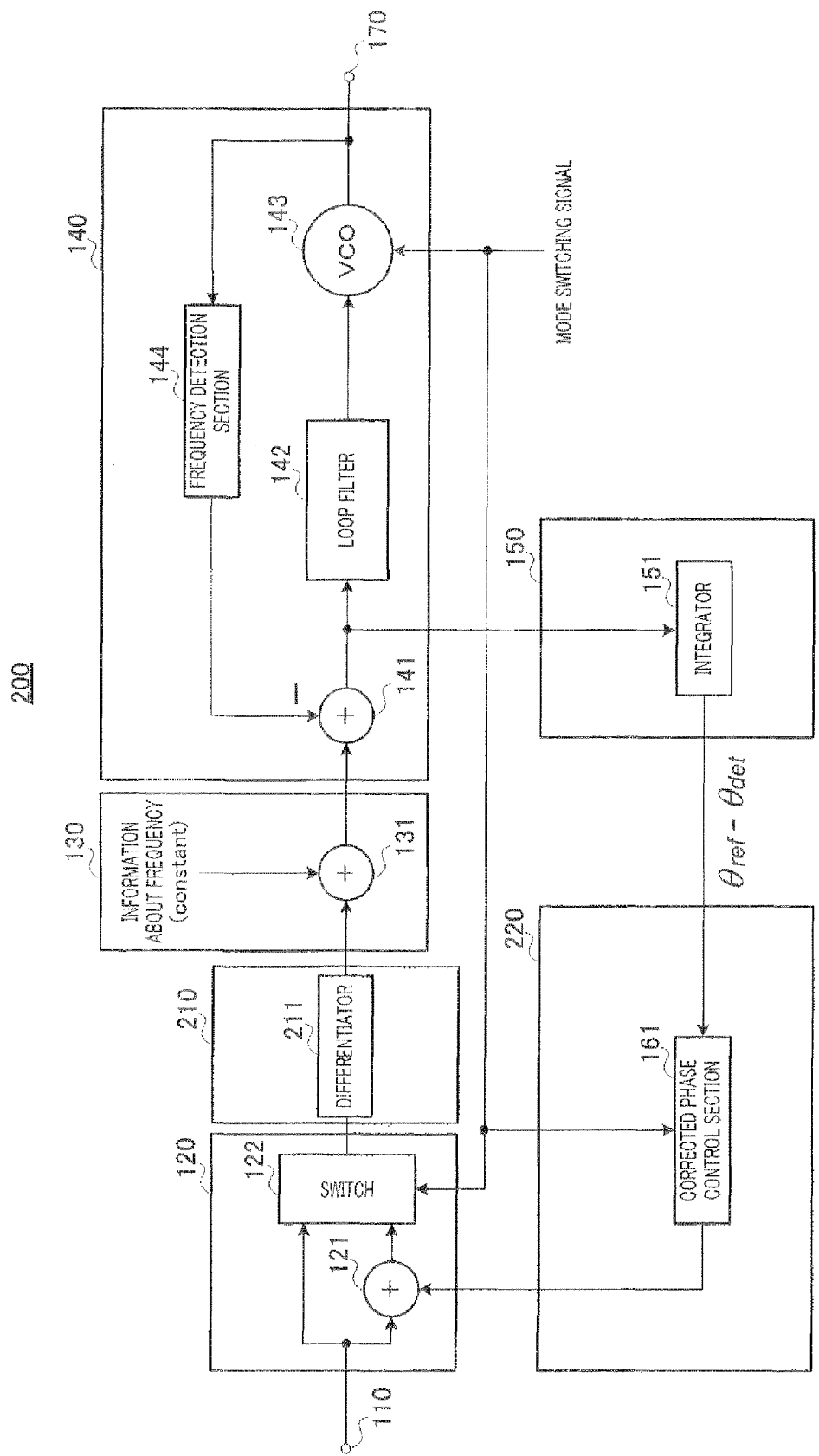
FIG. 8 is a block diagram showing a main configuration of an angle modulator according to Embodiment 1.

FIG. 8 is a block diagram showing a main configuration of an angle modulator when the angle signal is a phase signal. Here, parts in the angle modulator of FIG. 8 that are the same as in FIG. 2 will be assigned the same reference numerals as in FIG. 2 and overlapping explanations will be omitted. Compared to angle modulator 100 of FIG. 2, angle modulator 200 of FIG. 8 is configured to include correction control section 220 instead of correction control section 160, and further add phase-frequency conversion section 210 in the later stage of correction section 120.

Phase-frequency conversion section 210 converts a phase signal into a frequency signal. Phase-frequency conversion section 210 is configured with differentiator 211, for example.

Compared to correction control section 160, correction control section 220 is configured to remove differentiator 162. That is, when the angle signal input to angle modulator 200 is a phase signal, adder 121 adds the phase domain control signal generated by correction control section 220 to the angle signal. Therefore, while, in angle modulator 100, correction section 120 is inserted in a frequency domain, in angle modulator 200, correction section 120 is inserted in a phase domain.

Embodiment 2

Figure 9:
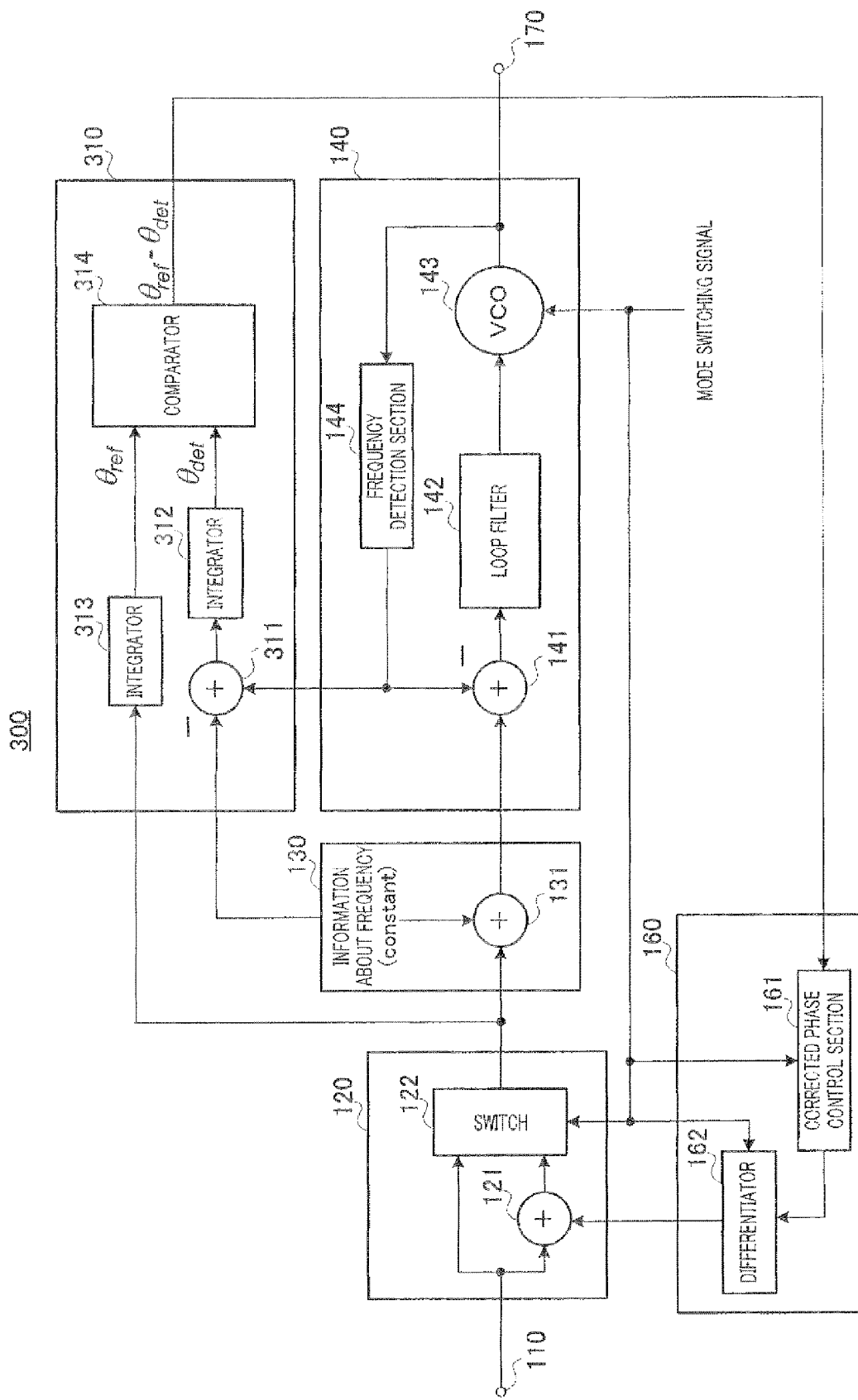
FIG. 9 is a block diagram showing a main configuration of an angle modulator according to Embodiment 2 of the present invention.

FIG. 9 is a block diagram showing a main configuration of an angle modulator according to Embodiment 2. Here, parts in the angle modulator of FIG. 9 that are the same as in FIG. 2 will be assigned the same reference numerals as in FIG. 2 and overlapping explanations will be omitted. Compared to angle modulator 100 of FIG. 2, angle modulator 300 of FIG. 9 is configured to include phase difference detection section 310 instead of phase difference detection section 150.

A case will be described below as an example where the operational mode of VCO 143 transitions from mode 1 to mode 2, as is the case with Embodiment 1. Flows of a signal and operations of each block that relate to input terminal 110, switch 122, adder 131, subtractor 141, loop filter 142, VCO 143, frequency detection section 144, and output terminal 170 in the steady state of mode 1 are the same as in Embodiment 1, and overlapping explanations will be omitted.

Phase difference detection section 310 includes subtractor 311, integrators 312 and 313, and comparator 314.

Subtractor 311 subtracts a constant corresponding to the center frequency of an angle modulated signal from the frequency of the angle signal detected by frequency detection section 144. Subtractor 311 outputs the result of the subtraction to integrator 312.

Integrator 312 integrates the subtraction result obtained in subtractor 311 to generate detection signal $\theta_{det}$, and outputs the generated detection signal $\theta_{det}$ to comparator 314.

Integrator 313 integrates the corrected signal output from correction section 120 to generate reference signal $\theta_{ref}$, and outputs generated reference signal $\theta_{ref}$ to comparator 314.

Comparator 314 generates the difference between reference signal $\theta_{ref}$ and detection signal $\theta_{det}$ as a difference of phases.

Here, subtractor 311 and integrators 313 and 312 in phase difference detection section 310 are reset and activated before the operational mode of VCO 143 is switched.

An operation of angle modulator 300 configured as described above, mainly an operation of phase compensation at the time when the operational mode of VCO 143 transitions, will be described below.

Figure 10:
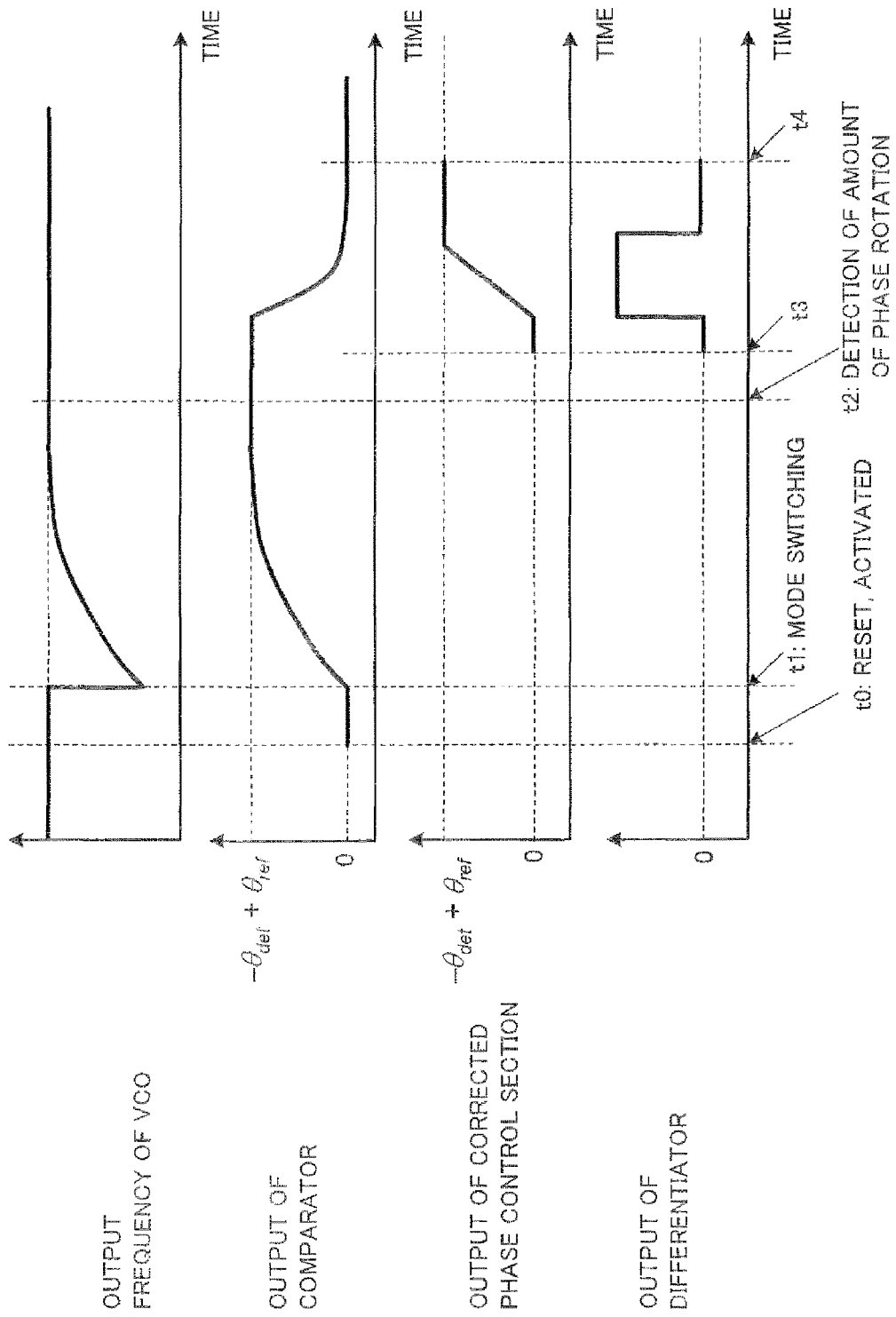
FIG. 10 shows output of each block according to Embodiment 2.

FIG. 10 shows an output frequency of VCO 143, an output value (difference of phases) of phase difference detection section 310 (comparator 314), an output value (phase domain control signal) of corrected phase control section 161, and an output value (frequency domain control signal) of differentiator 162. Further, in FIG. 10, time t1 represents the timing of mode switching, and time t0 represents time before time t1 of the timing of mode switching, and the timing at which integrators 312 and 313 are reset and activated. Further, time t2 represents the time after the frequency of VCO 143 is stabilized, and time t3 represents time after t2.

As shown in FIG. 10, integrators 313 and 312 integrate an input signal from time t0, which is before the timing of mode switching, to time t2, to obtain $\theta_{ref}$ and $\theta_{det}$. Then, at time t3 that is after time t2, comparator 314 outputs the amount of phase change $(-\theta_{det}+\theta_{ref})$ that is obtained from time t0 to time t2.

As shown in FIG. 10, integrators 313 and 312 integrates the input signal from time t0, which is before the timing of mode switching, to time t2, to obtain $\theta_{ref}$ and $\theta_{det}$. Then, at time t3 that is after time t2, comparator 314 outputs the amount of phase change $(-\theta_{det}+\theta_{ref})$ that is obtained from time t0 to time t2.

By doing so, in adder 121, a rectangular signal is added to the signal input from input terminal 110.

During a period in which the rectangular signal is output from differentiator 162 to adder 121 (i.e. from time t3 to time t4), switch 122 is controlled so as to be connected to adder 121. By this means, control is performed so that, during the rectangular signal is output from differentiator 162 to adder 121, the signal after addition is output to adder 131. By using this control, it is possible to compensate the amount of phase rotation accompanying the transition of the operational mode of VCO 143.

When the bandwidth for modulation is wider than the loop bandwidth of frequency locked loop circuit 140, it is possible to apply two-point modulation, as described in Embodiment 1. In this case, it is possible to additionally provide a path that connects output of adder 131 to input of VCO 143.

As described above, according to the present embodiment, when an angle signal input to angle modulator 300 is a frequency signal, phase difference detection section 310 includes subtractor 311 that subtracts a constant corresponding to the center frequency of an angle modulated signal from the frequency detected by frequency detection section 144; first integrator 312 that generates a detection signal by integrating output of subtractor 311; second integrator 313 that generates a reference signal by integrating the angle signal to which a control signal is added by correction section 120; and comparator 314 that generates the difference between the reference signal and the detection signal as a difference of phases. Correction control section 160 includes corrected phase control section 161 that generates a compensated phase domain phase signal based on that difference of phases, and differentiator 162 that generates a compensated frequency domain frequency signal as a control signal by differentiating the compensated phase signal.

Figure 11:
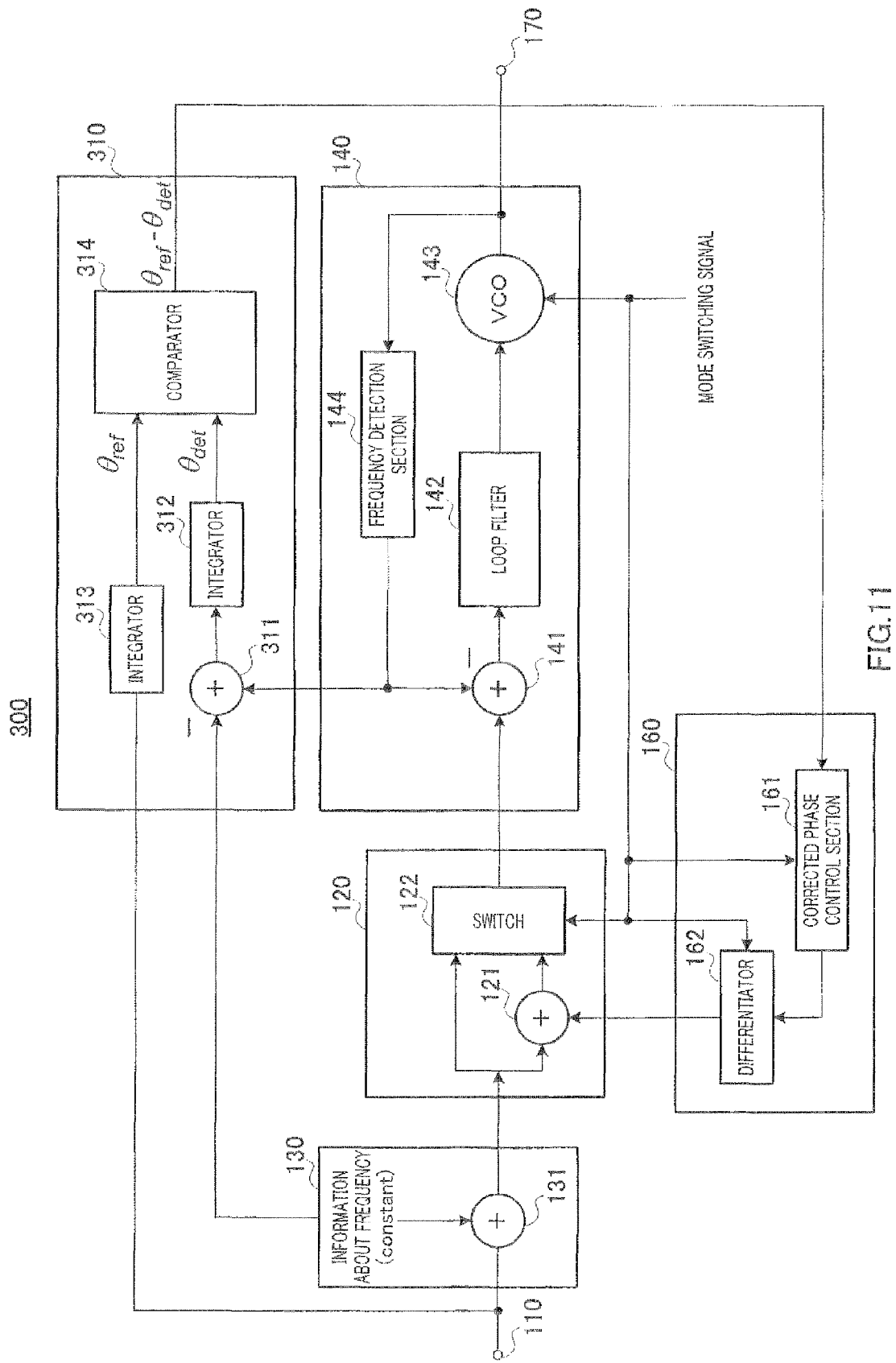
FIG. 11 is a block diagram showing another main configuration of an angle modulator according to Embodiment 2.

Further, the position in which correction section 120 is inserted can be any position between output of input terminal 110 and input of VCO 143, as is the case with Embodiment 1. That is, it is possible to provide correction section 120 anywhere in the earlier stage of VCO 143. FIG. 11 is a block diagram showing a main configuration of angle modulator 300 in which correction section 120 is provided between adjustment section 130 and frequency locked loop circuit 140.

A case has been described with the above embodiment where the angle signal input to the angle modulator is a frequency signal. That is, a case has been described where a control signal is added to an angle signal in a frequency domain. Here, when the angle signal input to the angle modulator is a phase signal, a configuration in which a control signal is added to an angle signal in a phase domain, is also possible.

Figure 12:
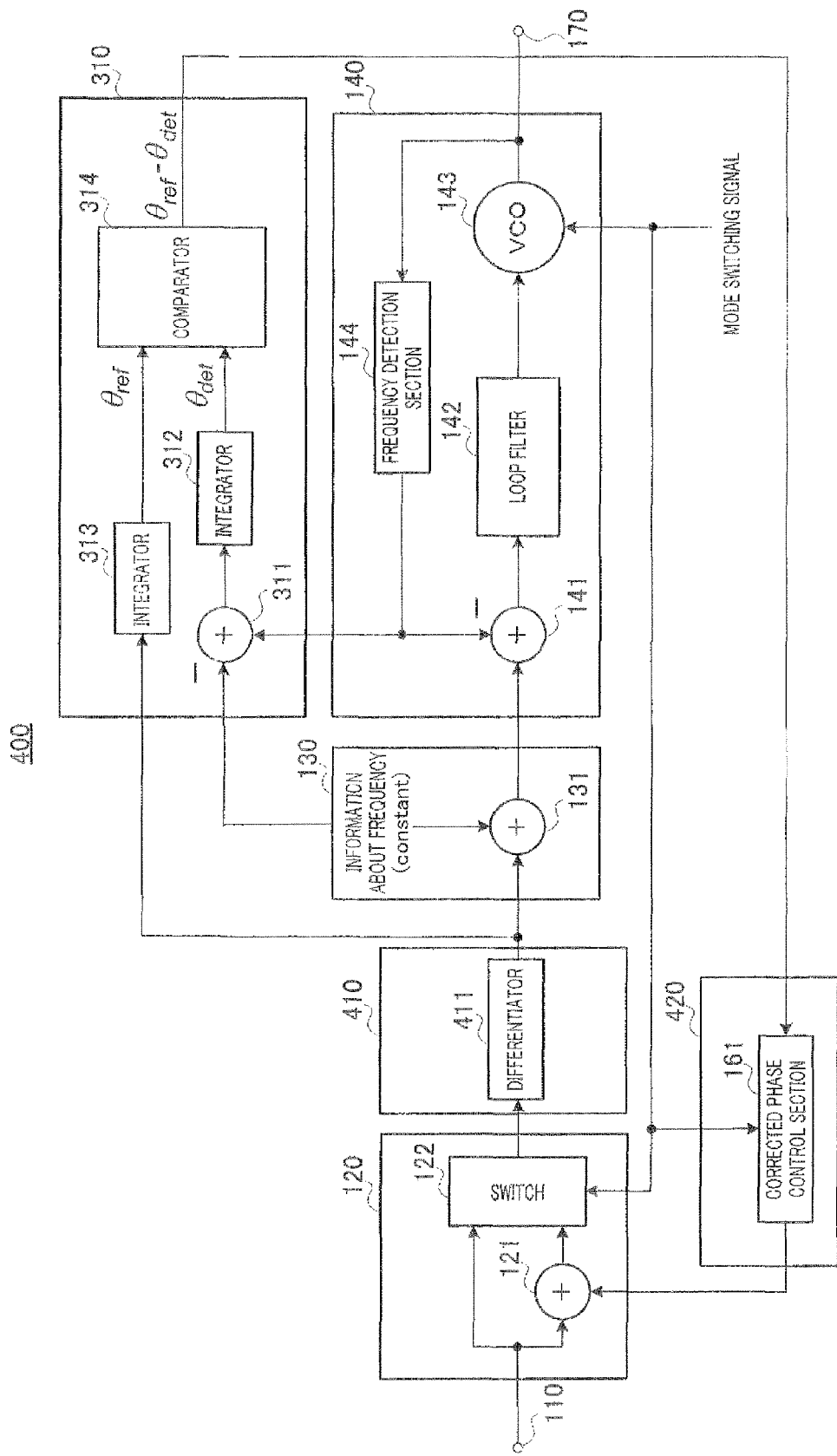
FIG. 12 is a block diagram showing a main configuration of an angle modulator according to Embodiment 2.

FIG. 12 is a block diagram showing a main configuration of an angle modulator when the angle signal is a phase signal. Here, parts in the angle modulator of FIG. 12 that are the same as in FIG. 9 will be assigned the same reference numerals as in FIG. 9 and overlapping explanations will be omitted. Compared to angle modulator 300 of FIG. 9, angle modulator 400 of FIG. 12 is configured to include correction control section 420 instead of correction control section 160, and further add phase-frequency conversion section 410 in the later stage of correction section 120.

Phase-frequency conversion section 410 converts a phase signal into a frequency signal. Phase-frequency conversion section 410 is configured with differentiator 411, for example.

Compared to correction control section 160, correction control section 420 is configured to remove differentiator 162. That is, when the angle signal input to angle modulator 400 is a phase signal, adder 121 adds the phase domain control signal generated by correction control section 420 to the angle signal. Therefore, while, in angle modulator 300, correction section 120 is inserted in a frequency domain, in angle modulator 400, correction section 120 is inserted in a phase domain.

The operation of angle modulator 400 of FIG. 12 is the same as the operation of angle modulator 300 of FIG. 9. In adder 121, output (phase domain control signal) of correction control section 420 is added to a phase signal input from input terminal 110, so that it is possible to compensate phase rotation due to mode switching of VCO 143.

Figure 13:
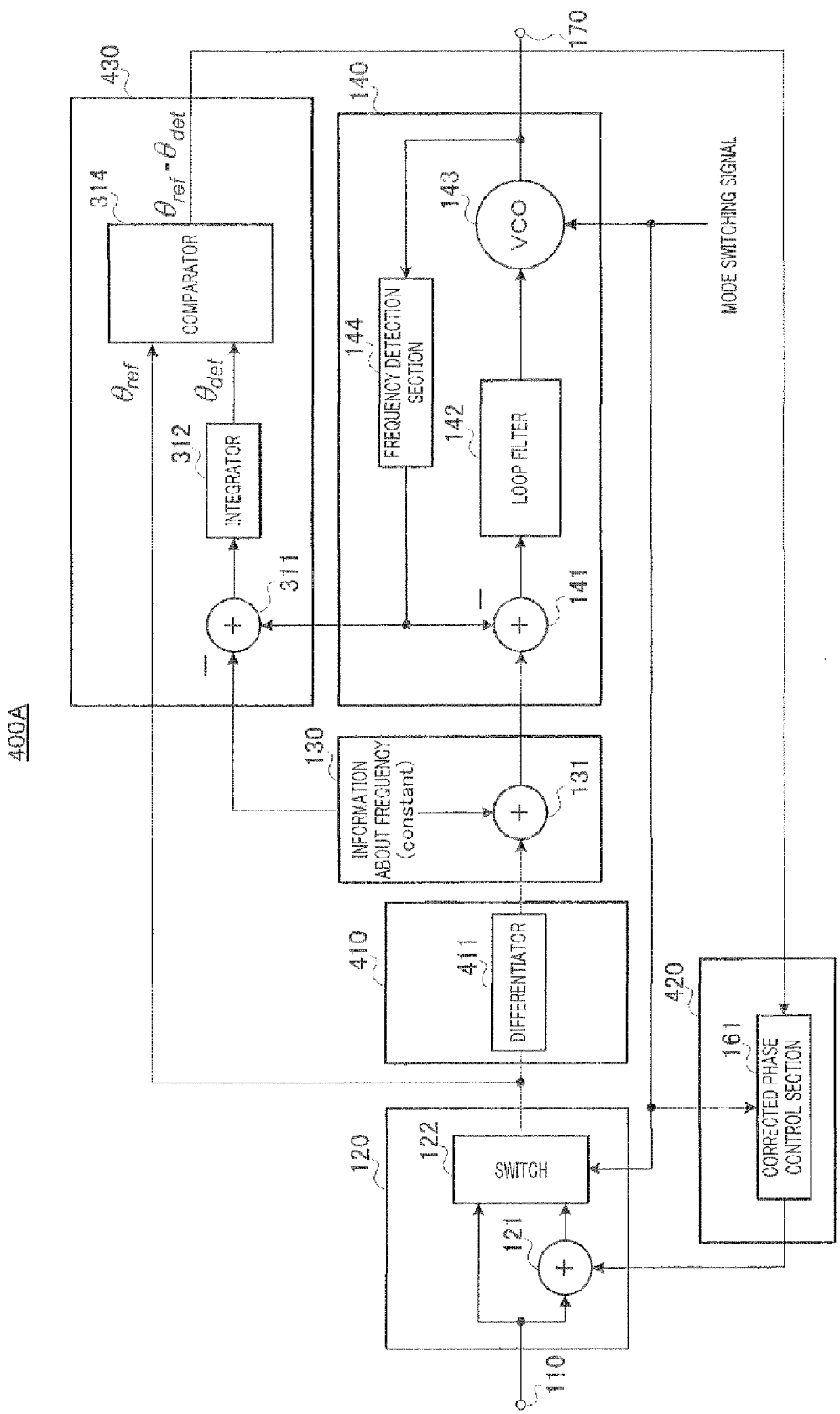
FIG. 13 is a block diagram showing a main configuration of an angle modulator according to Embodiment 2.

FIG. 13 is a block diagram showing another main configuration of an angle modulator when the angle signal is a phase signal. Here, parts in the angle modulator of FIG. 13 that are the same as in FIG. 12 will be assigned the same reference numerals as in FIG. 12 and overlapping explanations will be omitted. Compared to angle modulator 400 of FIG. 12, angle modulator 400A of FIG. 13 includes phase difference detection section 430 instead of phase difference detection section 310.

Compared to phase difference detection section 310, phase difference detection section 430 is configured to remove integrator 313, and an angle signal to input to angle modulator 400A is directly input to comparator 314. Compared to angle modulator 400, because angle modulator 400A does not require integrator 313, it is possible to reduce the circuit size.

Embodiment 3

A case will be described with the present embodiment where the correction control section generates a pulse that is different in size per sampling interval, as a control signal, when a phase is corrected by adding a control signal to the angle signal input to an angle modulator, in a frequency domain.

Figure 14:
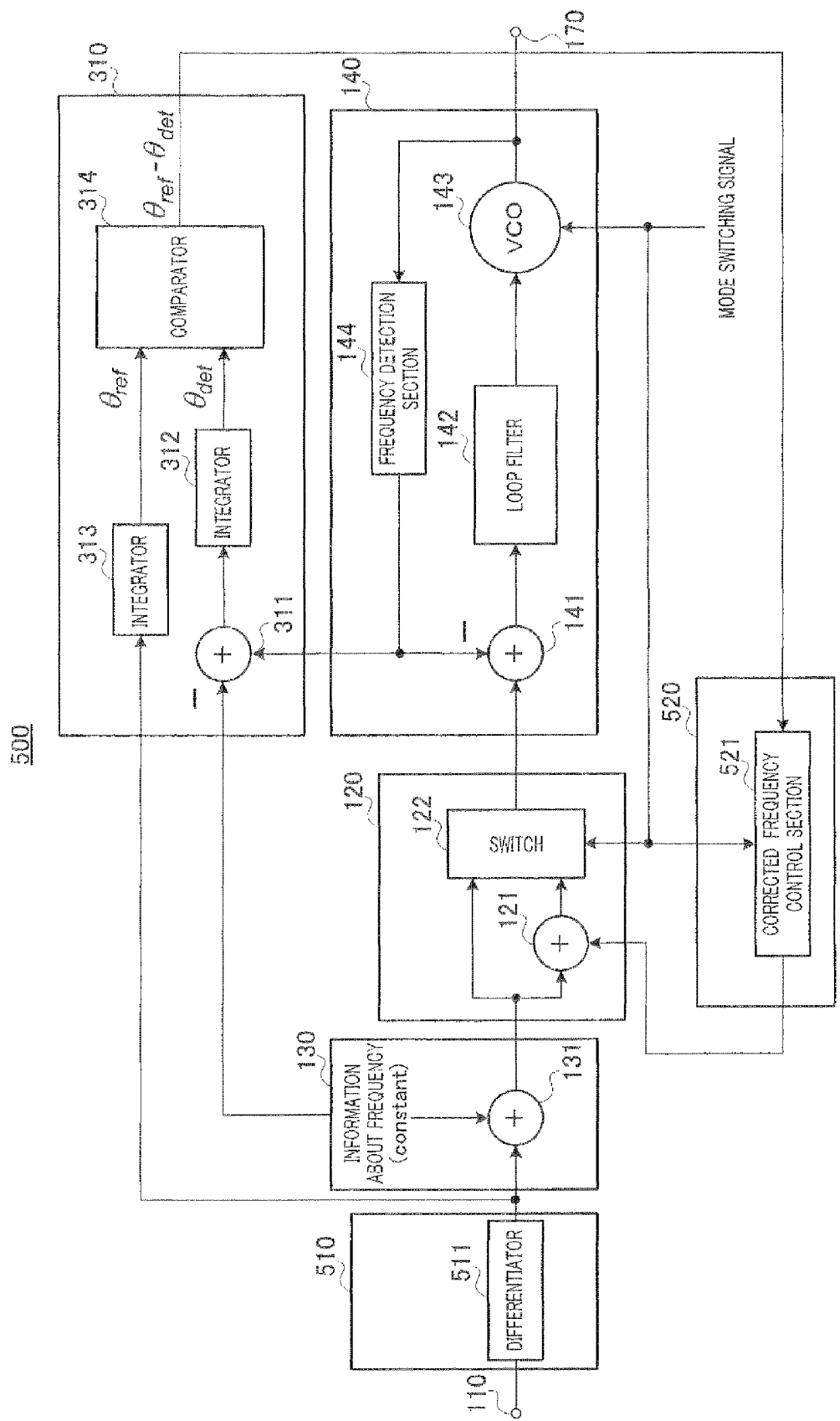
FIG. 14 is a block diagram showing a main configuration of an angle modulator according to Embodiment 3 of the present invention.

FIG. 14 is a block diagram showing a main configuration of an angle modulator according to the present embodiment. Here, parts in the angle modulator of FIG. 14 that are the same as in FIG. 11 will be assigned the same reference numerals as in FIG. 11 and overlapping explanations will be omitted. Compared to angle modulator 300 of FIG. 11, angle modulator 500 of FIG. 14 is configured to include correction control section 520 instead of correction control section 160, and further add phase-frequency conversion section 510 in the earlier stage of adjustment section 130. While, in angle modulator 300, the angle signal is a phase signal, in angle modulator 500, the angle signal is a frequency signal.

Phase-frequency conversion section 510 converts a phase signal into a frequency signal. Phase-frequency conversion section 510 is configured with differentiator 511, for example.

Correction control section 520 includes corrected frequency control section 521, and corrected frequency control section 521 generates a frequency domain control signal. Specifically, corrected frequency control section 521 generates a pulse in which the output level and the area of comparator 314 matches, as a control signal. Corrected frequency control section 521 outputs the generated control signal to adder 121. The control signal generated by corrected frequency control section 521 will be described below.

Figure 15:
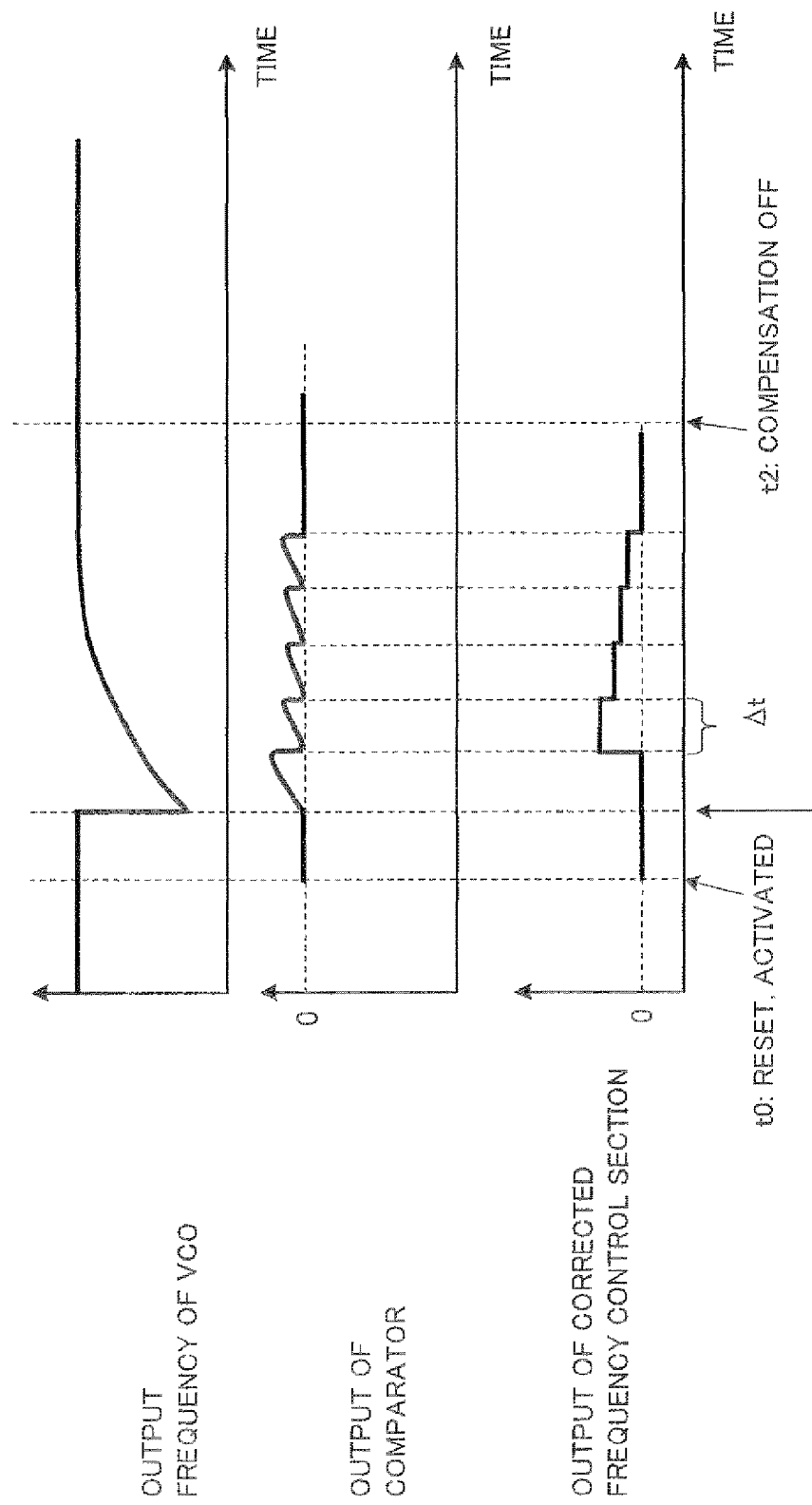
FIG. 15 shows output of each block according to Embodiment 3.

FIG. 15 shows an output frequency of VCO 143, an output value (difference of phases) of comparator 314, and an output value (frequency domain control signal) of corrected frequency control section 521. Further, in FIG. 15, time t1 represents the timing of mode switching, and time t0 represents time before time t1 of the timing of mode switching, and the timing at which integrators 312 and 313 are reset and activated. Further, time t2 represents time after the frequency of VCO 143 is stabilized.

As shown in FIG. 15, corrected frequency control section 521 generates a corrected pulse in which the output level and the area of comparator 314 matches, as a control signal, at a time interval of Δt, and outputs the generated control signal to adder 121. By doing so, corrected frequency control section 521 outputs a corrected pulse corresponding to the output (difference of phases) of comparator 314, at the time interval of Δt. At this time, corrected frequency control section 521 changes the scale of the corrected pulse according to the level of each sampling point. As is clear from FIG. 15, according to the present control, in Embodiment 1 and Embodiment 2, compensation of the phase is performed during the period from time t1 to time t2, at which, originally, compensation is not performed, so that it is possible to shorten the time required for phase compensation.

As described above, according to the present embodiment, correction control section 520 generates a pulse waveform corresponding to the difference of phases for each period (Δt) that is before a predetermined period in which the phase of the angle modulated signal is corrected in correction section 120 and is shorter than that predetermined period, as a frequency domain control signal. By this means, phase compensation is started at relatively early time from the timing of mode switching, so that it is possible to shorten the time required for completion of phase compensation from the timing of mode switching.

The position in which correction section 120 that is configured with adder 121 and switch 122 is inserted can be an arbitrary position between output of adjustment section 130 and input of VCO 143. However, from the viewpoint of converging time of frequency locked loop circuit 140, it is preferable to provide correction section 120 between adjustment section 130 and subtractor 141. Further, it is possible to employ a configuration in which switch 122 is removed and the result of the addition in adjustment section 130 always pass through adder 121. In this case, however, during the period in which phase compensation is not performed, it is necessary to perform control so that output (frequency domain control signal) of corrected frequency control section 521 becomes 0.

Further, phase difference detection section 310 can employ a configuration of phase difference detection section 150 shown in FIG. 2.

Embodiment 4

Angle modulators have been described with Embodiment 1 to Embodiment 3. A transmission apparatus including each angle modulator according to Embodiment 1 to Embodiment 3 will be described with the present embodiment.

Figure 16:
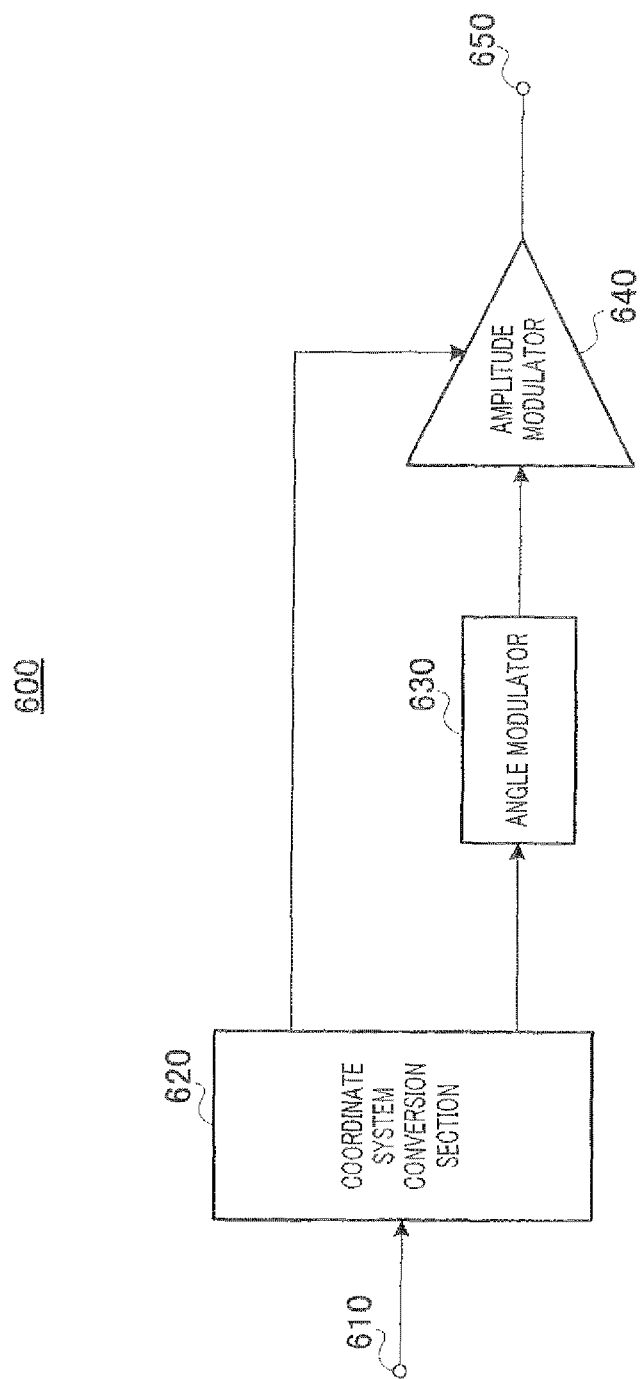
FIG. 16 is a block diagram showing a main configuration of a transmission apparatus according to Embodiment 4 of the present invention.

FIG. 16 is a block diagram showing a main configuration of a transmission apparatus according to the present embodiment.

Transmission apparatus 600 includes coordinate system conversion section 620, angle modulator 630, and amplitude modulator 640. In FIG. 16, each angle modulator in which the input angle signal is a phase signal, which is described in FIG. 8; FIG. 12, FIG. 13, and FIG. 14, is applied to angle modulator 630.

An I signal and a Q signal are input to coordinate system conversion section 620. Coordinate system conversion section 620 converts the I signal and the Q signal into an amplitude signal and a phase signal, outputs the phase signal to angle modulator 630, and outputs the amplitude signal to a power voltage terminal of amplitude modulator 640.

Angle modulator 630 angle modulates the phase signal to generate an angle modulated signal. Angle modulator 630 outputs the generated angle modulated signal to amplitude modulator 640.

Amplitude modulator 640 amplitude modulates the angle modulated signal using the amplitude signal output from coordinate system conversion section 620, and outputs the obtained modulated signal from output terminal 650.

Figure 17:
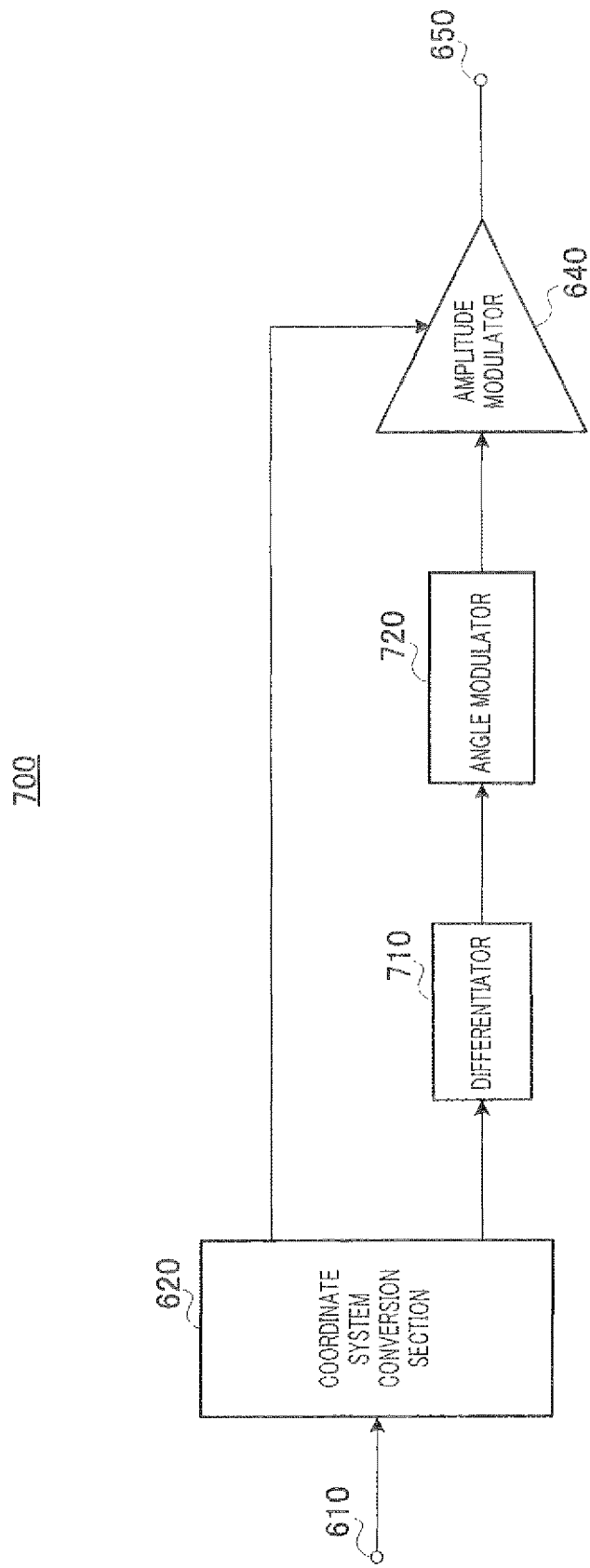
FIG. 17 is a block diagram showing another main configuration of a transmission apparatus according to Embodiment 4.

FIG. 17 is a block diagram showing another main configuration of a transmission apparatus according to the present embodiment. Here, parts in the transmission apparatus of FIG. 17 that are the same as in FIG. 16 will be assigned the same reference numerals as in FIG. 16 and overlapping explanations will be omitted. Compared to transmission apparatus 600 of FIG. 16, transmission apparatus 700 of FIG. 17 is configured to include angle modulator 720 instead of angle modulator 630, and add differentiator 710 between coordinate system conversion section 620 and angle modulator 720. In FIG. 17, each angle modulator in which the input angle signal is a frequency signal, which is described in FIG. 2, FIG. 6, FIG. 7, FIG. 9, and FIG. 11, is applied to angle modulator 720.

That is, while transmission apparatus 600 employs angle modulator 630 in which the frequency signal is used as an angle signal, transmission apparatus 700 employs angle modulator 720 in which the phase signal is used as an angle signal. Therefore, transmission apparatus 700 differs from transmission apparatus 600 in that a phase signal output from coordinate system conversion section 620 is differentiated in differentiator 710 and then input to angle modulator 720.

As described above, according to the present embodiment, transmission apparatus 600 is configured such that coordinate system conversion section 620 receives as input an I signal and a Q signal and outputs an amplitude signal and a phase signal corresponding to the I signal and the Q signal; angle modulator 630 is an angle modulator that receives as input a phase signal, as described in Embodiment 1 to Embodiment 3, and angle modulates the phase signal to generate an angle modulated signal; and amplitude modulator 640 amplitude modulates the angle modulated signal, according to the amplitude signal, to generate a modulated signal.

Further, transmission apparatus 700 is configured such that coordinate system conversion section 620 receives as input an I signal and a Q signal and outputs an amplitude signal and a phase signal corresponding to the I signal and the Q signal; differentiator 710 converts the phase signal into a frequency signal; angle modulator 720 receives as input the frequency signal and angle modulates the frequency signal to generate an angle modulated signal, as described in Embodiment 1 to Embodiment 3; and amplitude modulator 640 amplitude modulates the angle modulated signal, according to the amplitude signal, to generate a modulated signal.

By this means, even when the operational mode of the angle modulator is switched, transmission apparatus 600 and transmission apparatus 700 can compensate phase discontinuity of the modulated signal.

Embodiment 5

A transmission apparatus has been described with Embodiment 4. A radio communication apparatus configured to include the transmission apparatus according to Embodiment 4 will be described with the present embodiment.

Figure 18:
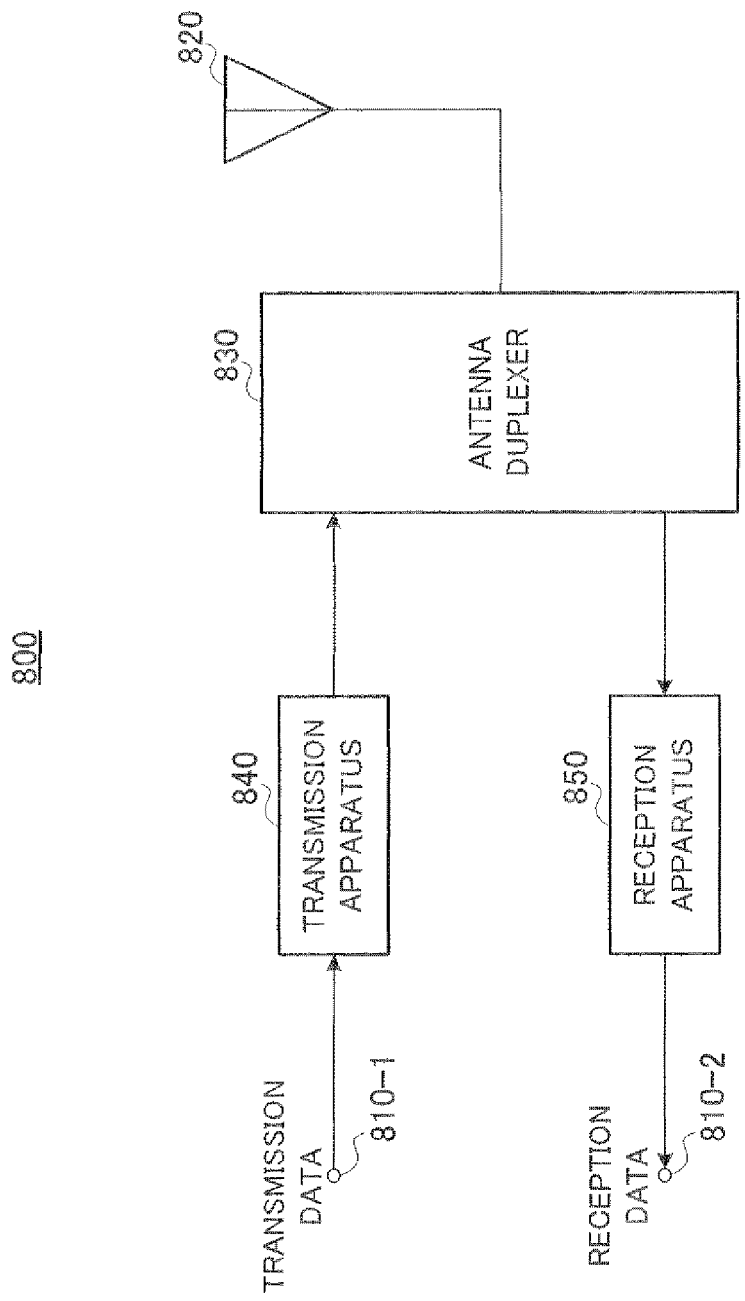
FIG. 18 is a block diagram showing a main configuration of a radio communication apparatus according to Embodiment 5 of the present invention.

FIG. 18 is a block diagram showing radio communication apparatus 800 according to Embodiment 5.

Radio communication apparatus 800 includes antenna 820, antenna duplexer 830, transmission apparatus 840, and reception apparatus 850. In FIG. 18, each transmission apparatus described in Embodiment 4 is applied to transmission apparatus 840. Specifically, as transmission apparatus 840, when the output signal is an angle modulated signal, it is possible to use angle modulators shown in FIG. 2, FIG. 6, FIG. 7, FIG. 8, FIG. 9, FIG. 11, FIG. 12, FIG. 13, and FIG. 14. Further, when the output signal of transmission apparatus 840 accompanies variation of the envelope, it is possible to use the configuration shown in FIG. 16 and FIG. 17, as transmission apparatus 840.

Transmission data is input from input terminal 810-1, and is modulated and converted into a radio frequency signal by transmission apparatus 840. Output of transmission apparatus 840 is radiated from antenna 820 via antenna duplexer 830. On the other hand, the reception signal input from antenna 820 is input to reception apparatus 850 via antenna duplexer 830. Antenna duplexer 830 is a block for discriminating transmission and reception, and is configured with a switch or a filter using an inductor or a SAW device. Reception apparatus 850 demodulates the received signal and outputs the reception data from output terminal 810-2. By applying each configuration described in Embodiment 4 as transmission apparatus 840, even when the operational mode of the transmission apparatus is switched, radio communication apparatus 800 can transmit a signal in which phase contiguousness is ensured, making it possible to reduce consumption power of radio communication apparatus 800.

The disclosure of Japanese Patent Application No. 2010-009156, filed on Jan. 19, 2010, including the specification, drawings and abstract, is incorporated herein by reference in its entirety.

INDUSTRIAL APPLICABILITY

An angle modulator, a transmission apparatus, and a radio communication apparatus according to the present invention can compensate phase discontinuity accompanying switching of an operational mode of VCO, making it possible to realize low power consumption, and is applicable to radio communication devices such as a mobile phone and a wireless LAN.

REFERENCE SIGNS LIST 100, 100A, 200, 300, 400, 400A, 500, 630, 720 Angle modulator
110, 810-1 Input terminal
120 Correction section
121, 131 Adder
122 Switch
130 Adjustment section
140 Frequency locked loop (FLL) circuit
141, 311 Subtractor
142 Loop filter
143 VCO
144 Frequency detection section
150, 310, 430 Phase difference detection section
151, 312, 313 Integrator
160, 220, 420, 520 Correction control section
161 Corrected phase control section
162, 211, 411, 511, 710 Differentiator
170, 810-2 Output terminal
180 Path
210, 410, 510 Phase-frequency conversion section
314 Comparator
521 Corrected frequency control section
600, 700, 840 Transmission apparatus
620 Coordinate system conversion section
640 Amplitude modulator
800 Radio communication apparatus
820 Antenna
830 Antenna duplexer
850 Reception apparatus

The invention claimed is:

1. An angle modulator using a frequency locked loop circuit,
the frequency locked loop comprising a subtractor, a loop filter, a voltage controlled oscillator that has a plurality of operational modes and generates an angle modulated signal by switching the operational mode according to a mode switching signal, and a frequency detection section that detects a frequency of the angle modulated signal, the subtractor subtracting the frequency detected by the frequency detection section from an input signal of the subtractor;
the angle modulator comprising:
a phase difference detection section that detects a difference of phases between an angle signal input to the angle modulator and the angle modulated signal;

a correction control section that inputs the mode switching signal, and that generates a control signal that compensates the difference of phases on the basis of the difference of phases and the input mode switching signal; and a correction section that corrects the phase of the angle modulated signal by adding the control signal to the angle signal, an input signal of the loop filter, or an input signal of the voltage controlled oscillator;

wherein the subtractor receives as input a frequency signal corresponding to the angle signal, or a frequency signal corresponding to a signal obtained by adding the control signal to the angle signal.

2. The angle modulator according to claim 1, wherein the phase difference detection section detects the difference of phases between the angle signal and the angle modulated signal using a result of subtraction by the subtractor.

3. The angle modulator according to claim 1, further comprising an adjustment section that adds a constant corresponding to a center frequency of the angle modulated signal to the angle signal, wherein the correction section corrects a phase of the angle modulated signal by adding the control signal to the angle signal to which the constant is added by the adjustment section, the input signal of the subtractor, the input signal of the loop filter, or the input signal of the voltage controlled oscillator.

4. The angle modulator according to claim 2, wherein:
the angle signal is a frequency signal;
the phase difference detection section comprises an integrator that detects the difference of phases by integrating the result of the subtraction by the subtractor; and
the correction control section comprises a corrected phase control section that generates a phase control signal as a phase domain control signal based on the difference of phases, and a conversion section that generates the frequency domain control signal by converting the phase control signal.

5. The angle modulator according to claim 2, wherein:
the angle signal is a phase signal; and further comprises:
a conversion section that generates a frequency signal corresponding to the angle signal or the signal obtained by adding the control signal to the angle signal; wherein:
the phase difference detection section comprises an integrator that detects the difference of phases by integrating the result of the subtraction by the subtractor;
the correction control section comprises a corrected phase control section that generates a phase domain control signal based on the difference of phases; and
the correction section corrects a phase of the angle modulated signal in a phase domain using the phase domain control signal.

6. The angle modulator according to claim 3, wherein
the angle signal is a frequency signal;
the phase difference detection section comprises:
the subtractor that subtracts the constant from the frequency detected by the frequency detection section;
a first integrator that generates a detection signal by integrating output of the subtractor;
a second integrator that generates a reference signal by integrating the input signal to which the control signal is added by the correction section; and
a comparator that generates a difference between the reference signal and the detection signal as the difference of phases; wherein:
the correction control section comprises a corrected phase control section that generates a phase control signal as a phase domain control signal, based on the difference of phases, and a conversion section that generates a frequency domain control signal by converting the phase control signal; and the correction section corrects the phase of the angle modulated signal in a frequency domain using the frequency domain control signal.

7. The angle modulator according to claim 3, wherein:
the angle signal is a phase signal, and further comprises:
a conversion section that generates a frequency signal corresponding to the angle signal or the signal obtained by adding the control signal to the angle signal; wherein:
the phase difference detection section comprises:
the subtractor that subtracts the constant from the frequency detected by the frequency detection section;
a first integrator that generates a detection signal by integrating output of the subtractor;
a second integrator that generates a reference signal by integrating the frequency signal obtained by the conversion section; and
a comparator that generates a difference between the reference signal and the detection signal as the difference of phases; wherein:
the correction control section comprises a corrected phase control section that generates a phase domain control signal based on the difference of phases; and
the correction section corrects the phase of the angle modulated signal in a phase domain using the phase domain control signal.

8. The angle modulator according to claim 3, wherein:
the angle signal is a phase signal, and further comprises:
a conversion section that generates a frequency signal corresponding to the angle signal or the signal obtained by adding the control signal to the angle signal; wherein:
the phase difference detection section comprises:
a subtractor that subtracts the constant from the frequency detected by the frequency detection section;
a first integrator that generates a detection signal by integrating output of the subtractor; and
a comparator that generates a difference between the corrected phase signal and the detection signal as the difference of phases; wherein:
the correction control section comprises a corrected phase control section that generates a phase domain control signal based on the difference of phases; and
the correction section corrects the phase of the angle modulated signal in a phase domain using the phase domain control signal.

9. The angle modulator according to claim 1, wherein the control signal is a waveform that changes from 0 to the difference of phases.

10. The angle modulator according to claim 9, wherein the control signal is a lamp signal.

11. The angle modulator according to claim 9, wherein the control signal is a rectangular wave.

12. The angle modulator according to claim 1, wherein the correction section corrects the phase of the angle modulated signal during a predetermined period after the operational mode of the voltage controlled oscillator is switched.

13. The angle modulator according to claim 12, wherein a starting time of the predetermined period is preset based on time when the operational mode is switched.

14. The angle modulator according to claim 12, wherein the starting time of the predetermined period is set based on a result of the detection of the phase difference detection section.

15. The angle modulator according to claim 1, wherein the correction control section generates a pulse waveform corresponding to the difference of phases for each period that is before a predetermined period in which the phase of the angle modulated signal is corrected in the correction section and is shorter than the predetermined period, as a frequency domain control signal.

16. A transmission apparatus comprising:
    a coordinate system conversion section that receives as input an I signal and a Q signal, and outputs an amplitude signal and a phase signal corresponding to the I signal and the Q signal;
    the angle modulator according to claim 1 that receives as input the phase signal, and generates the angle modulated signal by angle modulating the phase signal; and
    an amplitude modulator that generates a modulated signal by amplitude modulating the angle modulated signal according to the amplitude signal.

17. A transmission apparatus comprising:
    a coordinate system conversion section that receives as input an I signal and a Q signal, and outputs an amplitude signal and a phase signal corresponding to the I signal and the Q signal; a conversion section that converts the phase signal into a frequency signal;
    the angle modulator according to claim 1 that receives as input the frequency signal, and generates the angle modulated signal by angle modulating the frequency signal; and
    an amplitude modulator that generates a modulated signal by amplitude modulating the angle modulated signal according to the amplitude signal.

18. A radio communication apparatus comprising:
    the transmission apparatus according to claim 16 that receives as input transmission data and generates the modulated signal;
    a reception apparatus that receives and modulates the modulated signal and outputs reception data;
    an antenna duplexer that is connected to output of the transmission apparatus and input of the reception apparatus; and
    an antenna that is connected to the other terminal of the antenna duplexer.

\* \* \* \* \*